US012699471B2

(12) United States Patent
Wang et al.

(10) Patent No.: US 12,699,471 B2
(45) Date of Patent: Aug. 4, 2026

(54) DISPLAY PANEL AND DISPLAY APPARATUS

(71) Applicants:CHENGDU BOE OPTOELECTRONICS TECHNOLOGY CO., LTD., Sichuan (CN); BOE TECHNOLOGY GROUP CO., LTD., Beijing (CN)

(72) Inventors: Siyu Wang, Beijing (CN); Wei Wang, Beijing (CN); Yi Zhang, Beijing (CN); Junxiu Dai, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/881,332

(22) PCT Filed: Sep. 28, 2022

(86) PCT No.: PCT/CN2022/122280
§ 371 (c)(1),
(2) Date: Jan. 6, 2025

(87) PCT Pub. No.: WO2024/065314
PCT Pub. Date: Apr. 4, 2024

(65) Prior Publication Data
US 2026/0003453 A1 Jan. 1, 2026

(51) Int. Cl.
*G06F 3/041* (2006.01)
*G06F 3/044* (2006.01)
*H10D 86/40* (2025.01)

(52) U.S. Cl.
CPC .......... *G06F 3/0412* (2013.01); *G06F 3/0446* (2019.05); *H10D 86/441* (2025.01);
(Continued)

(58) Field of Classification Search
None
See application file for complete search history.

(56) References Cited

U.S. PATENT DOCUMENTS

2007/0008299 A1* 1/2007 Hristov ................. G06F 3/0443
345/173
2009/0085891 A1* 4/2009 Yang ..................... G06F 3/0412
345/174
(Continued)

FOREIGN PATENT DOCUMENTS

CN 105446570 A 3/2016
CN 111913318 A 11/2020
(Continued)

OTHER PUBLICATIONS

International Search Report of application No. PCT/CN2022/122280 dated Apr. 28, 2023.
(Continued)

*Primary Examiner* — Dorothy Harris
(74) *Attorney, Agent, or Firm* — Calfee, Halter & Griswold LLP

(57) ABSTRACT

A display panel includes: a base substrate, a touch functional layer, a plurality of first binding pins, a plurality of first touch leads, and a plurality of second touch leads. The base substrate includes a display area and a first bezel area, the first bezel area being located on one side of the display area in a first direction. The first bezel area includes a binding area. The touch functional layer is located on one side of the base substrate, the touch functional layer including a plurality of first touch electrodes, and the orthographic projections of the first touch electrodes on the base substrate being located in the display area. The orthographic projections of the plurality of first binding pins on the base substrate are
(Continued)

located in the binding area, the first binding pins being arranged corresponding to the first touch electrodes.

19 Claims, 14 Drawing Sheets

(52) U.S. Cl.
CPC .............. *G06F 2203/04107* (2013.01); *G06F 2203/04111* (2013.01)

(56) References Cited

U.S. PATENT DOCUMENTS

| | | | | | |
|---|---|---|---|---|---|
| 2010/0060601 | A1* | 3/2010 | Oohira | .............. | G02F 1/133308 |
| | | | | | 345/173 |
| 2010/0085326 | A1* | 4/2010 | Anno | ................. | H03K 17/9622 |
| | | | | | 345/174 |
| 2013/0106747 | A1* | 5/2013 | Choi | .................... | G06F 3/0446 |
| | | | | | 345/173 |
| 2014/0028599 | A1* | 1/2014 | Jeong | ...................... | G06F 3/047 |
| | | | | | 345/173 |
| 2014/0043292 | A1* | 2/2014 | Hashimoto | ........... | G06F 3/0446 |
| | | | | | 345/174 |
| 2015/0185935 | A1* | 7/2015 | Jang | .................... | G06F 3/04166 |
| | | | | | 345/174 |

FOREIGN PATENT DOCUMENTS

| | | |
|---|---|---|
| CN | 112346277 A | 2/2021 |
| CN | 112817488 A | 5/2021 |
| CN | 113050840 A | 6/2021 |
| CN | 113778267 A | 12/2021 |
| CN | 115113764 A | 9/2022 |

OTHER PUBLICATIONS

Written opinion of application No. PCT/CN2022/122280 dated Apr. 28, 2023.

* cited by examiner

DISPLAY PANEL AND DISPLAY APPARATUS

CROSS-REFERENCE TO RELATED APPLICATION

The present application is a National Stage of International Application No. PCT/CN2022/122280, filed on Sep. 28, 2022, the entire disclosure of which is incorporated herein by reference for all purposes.

TECHNICAL FIELD

The present disclosure relates to the field of display technology, and in particular to a display panel and a display apparatus.

BACKGROUND

In the related art, a display panel with a flexible multi-layer on cell (FMLOC) structure needs to be provided with pins for connecting the touch function layer in the lower frame area of the display panel, and a large number of pins will limit the width of the lower frame of the display panel.

It should be noted that, the information disclosed in the above background technology section is only used to enhance the understanding of the background of the present disclosure, and therefore may include information that does not constitute prior art known to ordinary technicians in the field.

SUMMARY

According to one aspect of the present disclosure, there is provided a display panel, including: a base substrate, a touch function layer, a plurality of first binding pins, a plurality of first touch leads, and a plurality of second touch leads. The base substrate includes a display area and a first frame area, the first frame area is located on a side of the display area in a first direction, and the first frame area includes a binding area; the touch function layer is located on a side of the base substrate, the touch function layer includes a plurality of first touch electrodes, and an orthographic projection of the first touch electrode on the base substrate is located in the display area; orthographic projections of the plurality of first binding pins on the base substrate are located in the binding area, the first binding pin is arranged corresponding to the first touch electrode; the first touch lead is connected between the first binding pin and the first touch electrode corresponding to each other, and the first touch lead is connected to a first end of the first touch electrode; the second touch lead is connected between the first touch electrode and the first touch lead connected to each other, and the second touch lead is connected to a second end of the first touch electrode, wherein the first binding pin is connected to the first touch electrode through the first touch lead and the second touch lead.

In an example embodiment of the present disclosure, the first touch lead includes a first extension portion, the second touch lead includes a second extension portion, and an orthographic projection of the first extension portion on the base substrate and an orthographic projection of the second extension portion on the base substrate are located in the first frame area; the display panel further includes: a plurality of first bridge lines, an orthographic projection of the first bridge line on the base substrate is located in the first frame area, and the first bridge line is connected between the first extension portion and the second extension portion connected to an identical first touch electrode.

In an example embodiment of the present disclosure, orthographic projections of the plurality of first extension portions on the base substrate extend along the first direction and are spaced along a second direction, and the second direction intersects with the first direction; orthographic projections of the plurality of second extension portions on the base substrate extend along the first direction and are spaced along the second direction, and the first extension portion and the second extension portion are located in an identical conductive layer; orthographic projections of the plurality of first bridge lines on the base substrate extend along the second direction and are spaced along the first direction, the first bridge line and the first extension portion are located in different conductive layers, and the first bridge line is connected to the first extension portion and the second extension portion through via holes respectively.

In an example embodiment of the present disclosure, the first frame area further includes a bending area and a first wiring area, the bending area is connected between the binding area and the display area, and the first wiring area is connected between the bending area and the binding area; the orthographic projection of the first bridge line on the base substrate, the orthographic projection of the first extension portion on the base substrate, and the orthographic projection of the second extension portion on the base substrate are all located in the first wiring area.

In an example embodiment of the present disclosure, the first frame area further includes a bending area and a second wiring area, the bending area is connected between the binding area and the display area, and the second wiring area is connected between the bending area and the display area; the orthographic projection of the first bridge line on the base substrate is located in the second wiring area.

In an example embodiment of the present disclosure, a size of the second wiring area in a second direction is greater than a size of the bending area in the second direction, and the second direction intersects with the first direction.

In an example embodiment of the present disclosure, the touch function layer further includes a second touch electrode, the first touch electrode includes a plurality of first sub-electrodes, and the second touch electrode includes a plurality of second sub-electrodes; the touch function layer includes: a first electrode layer, and a second electrode layer, the first electrode layer is located on a side of the base substrate, the first electrode layer includes the first bridge line and a connecting bridge, the connecting bridge is used to connect adjacent first sub-electrodes, or the connecting bridge is used to connect adjacent second sub-electrodes; the second electrode layer is located on a side of the first electrode layer away from the base substrate, the second electrode layer includes the first extension portion, the second extension portion, the first sub-electrode, and the second sub-electrode.

In an example embodiment of the present disclosure, the first frame area further includes a bending area, the bending area is connected between the binding area and the display area; the orthographic projection of the first bridge line on the base substrate, the orthographic projection of the first extension portion on the base substrate, and the orthographic projection of the second extension portion on the base substrate are all located in the bending area.

In an example embodiment of the present disclosure, the bending area includes a thinning area and a normal area distributed in the first direction, and a thickness of the display panel in the thinning area is smaller than a thickness of the display panel in the normal area; the orthographic projection of the first bridge line on the base substrate is located in the normal area.

In an example embodiment of the present disclosure, the display panel further includes: a pixel circuit layer, the pixel circuit layer is located between the base substrate and the touch function layer, and the pixel circuit layer includes: a first source/drain layer and a second source/drain layer, the first source/drain layer is located between the base substrate and the touch function layer, the first source/drain layer includes the first bridge line; the second source/drain layer is located between the first source/drain layer and the touch function layer, the second source/drain layer includes the first extension portion and the second extension portion.

In an example embodiment of the present disclosure, an arrangement sequence of the orthogonal projections of the first binding pins on the base substrate in a second direction is identical with an arrangement sequence of the orthogonal projections of the first extension portions connected to the first binding pins on the base substrate in the second direction, and the second direction intersects with the first direction; the arrangement sequence of the orthogonal projections of the first binding pins on the base substrate in the second direction is opposite to an arrangement sequence of the orthogonal projections of the second extension portions connected to the first binding pins on the base substrate in the second direction.

In an example embodiment of the present disclosure, the first touch lead includes: a first lead-out line, a first connection line, and a first sequence change line, an orthographic projection of the first lead-out line on the base substrate extends along the first direction, the first lead-out line is connected to the first binding pin; an orthographic projection of the first connection line on the base substrate extends along the first direction, the first connection line is connected to the first end of the first touch electrode; an orthographic projection of the first sequence change line on the base substrate extends along a second direction, the second direction intersects with the first direction, the first sequence change line is connected between the first lead-out line and the first connection line. The second touch lead includes: a second lead-out line, a second connection line, and a second sequence change line, an orthographic projection of the second lead-out line on the base substrate extends along the first direction, the second lead-out line is connected to the first lead-out line, and orthographic projections of the first lead-out line and second lead-out line connected to each other on the base substrate are arranged adjacent to each other; an orthographic projection of the second connection line on the base substrate extends along the first direction, the second connection line is connected to the second end of the first touch electrode. An orthographic projection of the second sequence change line on the base substrate extends along the second direction, the second sequence change line is connected between the second lead-out line and the second connection line.

In an example embodiment of the present disclosure, an arrangement sequence of the orthogonal projections of the first binding pins on the base substrate in the second direction is identical with an arrangement sequence of the orthogonal projections of the first lead-out lines connected to the first binding pins on the base substrate in the second direction; the arrangement sequence of the orthogonal projections of the first binding pins on the base substrate in the second direction is identical with an arrangement sequence of the orthogonal projections of the second lead-out lines connected to the first binding pins on the base substrate in the second direction; the arrangement sequence of the orthogonal projections of the first binding pins on the base substrate in the second direction is identical with an arrangement sequence of the orthogonal projections of the first connection lines connected to the first binding pins on the base substrate in the second direction; and the arrangement sequence of the orthogonal projections of the first binding pins on the base substrate in the second direction is opposite to an arrangement sequence of the orthogonal projections of the second connection lines connected to the first binding pins on the base substrate in the second direction.

In an example embodiment of the present disclosure, the first lead-out line includes a third extension portion, an orthographic projection of the third extension portion on the base substrate extends along the first direction; the second lead-out line includes a fourth extension portion, an orthographic projection of the fourth extension portion on the base substrate extends along the first direction; the first connection line includes a fifth extension portion, an orthographic projection of the fifth extension portion on the base substrate extends along the first direction; the second connection line includes a sixth extension portion, an orthographic projection of the sixth extension portion on the base substrate extends along the first direction; the third extension portion, the fourth extension portion, the fifth extension portion, and the sixth extension portion are located in an identical conductive layer, the first sequence change line and the second sequence change line are located in an identical conductive layer, and the first sequence change line and the third extension portion are located in different conductive layers, the first sequence change line is connected to the third extension portion and the fifth extension portion through via holes respectively, and the second sequence change line is connected to the fourth extension portion and the sixth extension portion through via holes respectively.

In an example embodiment of the present disclosure, the first frame area further includes a bending area, and the bending area is connected between the binding area and the display area; the orthographic projections of the third extension portion, the fourth extension portion, the fifth extension portion, the sixth extension portion, the first sequence change line, and the second sequence change line on the base substrate are located in the bending area.

In an example embodiment of the present disclosure, the display panel further includes: a pixel circuit layer, the pixel circuit layer is located between the base substrate and the touch function layer, and the pixel circuit layer includes: a first source/drain layer, and a second source/drain layer, the first source/drain layer is located between the base substrate and the touch function layer, the first source/drain layer includes the first sequence change line and the second sequence change line; the second source/drain layer is located between the first source/drain layer and the touch function layer, the second source/drain layer includes the third extension portion, the fourth extension portion, the fifth extension portion and the sixth extension portion.

In an example embodiment of the present disclosure, the bending area includes a thinning area and a normal area distributed in the first direction, and a thickness of the display panel in the thinning area is smaller than a thickness of the display panel in the normal area; the orthographic projections of the first sequence change line and the second sequence change line on the base substrate are located in the normal area.

In an example embodiment of the present disclosure, the touch function layer further includes: a second touch electrode, the first touch electrode includes a plurality of first sub-electrodes distributed in an identical direction, the second touch electrode includes a plurality of second sub-electrodes distributed in an identical direction, and a distribution direction of the first sub-electrodes intersects with a distribution direction of the second sub-electrodes; the first sub-electrodes and the second sub-electrodes are located in an identical conductive layer, and a size of the orthographic projection of the first touch electrode on the base substrate in an extension direction of the first touch electrode is greater than a size of the orthographic projection of the second touch electrode on the base substrate in an extension direction of the second touch electrode.

In an example embodiment of the present disclosure, the display panel further includes: a first protection line, the first protection line is used to provide a touch signal, and the first protection line includes: a third lead-out line, a third connection line, and a third sequence change line, an orthographic projection of the third lead-out line on the base substrate extends along the first direction, the third lead-out line is connected to a second binding pin, and the orthographic projections of all first lead-out lines on the base substrate and the orthographic projections of all second lead-out lines on the base substrate are located on an identical side of the orthographic projection of the third lead-out line on the base substrate; an orthographic projection of the third connection line on the base substrate extends along the first direction, the orthographic projection of the third connection line on the base substrate is located between the orthographic projections of the first connection line and the second connection line adjacent to each other on the base substrate; an orthographic projection of the third sequence change line on the base substrate extends along the second direction, the third sequence change line is connected between the third lead-out line and the third connection line.

According to one aspect of the present disclosure, there is provided a display apparatus, including the display panel described above.

It should be understood that the above general description and the detailed description below are only exemplary and explanatory, and cannot limit the present disclosure.

BRIEF DESCRIPTION OF THE DRAWINGS

The drawings herein are incorporated into the specification and constitute a part of the specification, showing embodiments consistent with the present disclosure, and are used together with the specification to explain the principles of the present disclosure. The drawings described below are only some embodiments of the present disclosure. For ordinary technicians in this field, other drawings can be obtained based on these drawings without creative work.

DETAILED DESCRIPTION

Figure 1:
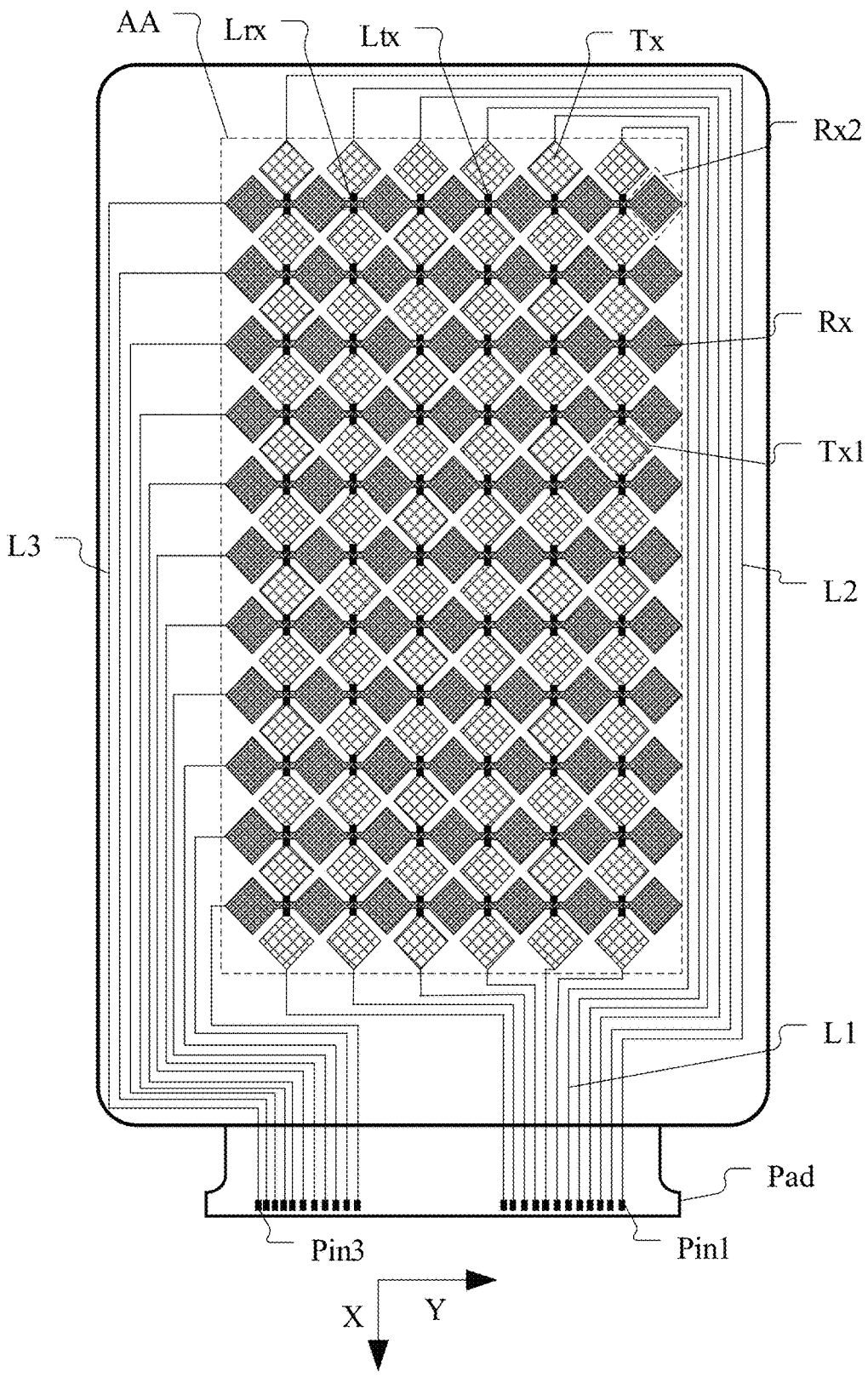
FIG. 1 is a structural schematic diagram of a display panel in the related art.

The example embodiments will now be described more fully with reference to the accompanying drawings. However, the example embodiments can be implemented in a variety of forms and should not be construed as being limited to the examples set forth herein; rather, these embodiments are provided so that the disclosure will be more comprehensive and complete and the concepts of the example embodiments will be fully conveyed to those skilled in the art. The same reference numerals in the drawings represent the same or similar structures, and their detailed descriptions will be omitted.

The terms "one", "an", and "the" are used to indicate the presence of one or more elements/components/etc.; the terms "including" and "having" are used to indicate an open-ended inclusion and mean that in addition to the listed elements/components/etc., additional elements/components/etc. may exist.

As shown in FIG. 1, a schematic diagram of the structure of a display panel in the related art is shown. The display panel may include a display area AA and a first frame area Pad. The display panel may also include a touch function layer, and the touch function layer may include: a first touch electrode Tx and a second touch electrode Rx. The first touch electrode Tx may include a plurality of first sub-electrodes Tx1 and a first connecting bridge Ltx, the first sub-electrodes Tx1 may be spaced along the first direction X, and the first connecting bridge Ltx may be connected between adjacent first sub-electrodes Tx1 in the first direction X. The second touch electrode Rx may include a plurality of second sub-electrodes Rx2 and a second connecting bridge Lrx, the second sub-electrodes Rx2 may be spaced along the second direction Y, and the second connecting bridge Lrx may be connected between adjacent second sub-electrodes Rx2 in the second direction Y. The first touch electrode Tx and the second touch electrode Rx may form a mutual capacitance structure, and the touch position may be determined by the change in capacitance.

As shown in FIG. 1, in the related art, the display panel may further include a first touch lead L1, a second touch lead L2, and a third touch lead L3. The third touch lead L3 is connected between the second touch electrode Rx and the third binding pin Pin3 located on the first frame area Pad. The first touch lead L1 is connected between the first binding pin Pin1 located on the first frame area Pad and the first end of the first touch electrode Tx, and the second touch lead L2 is connected between the first binding pin Pin1 located on the first frame area Pad and the second end of the first touch electrode Tx. The display panel can provide a touch signal to the same first touch electrode Tx through the first touch lead L1 and the second touch lead L2, and this setting can improve the touch delay problem. However, the display panel needs to be provided with more first binding pins Pin1, so that the setting increases the size of the first frame area Pad in the second direction Y.

Figure 2:
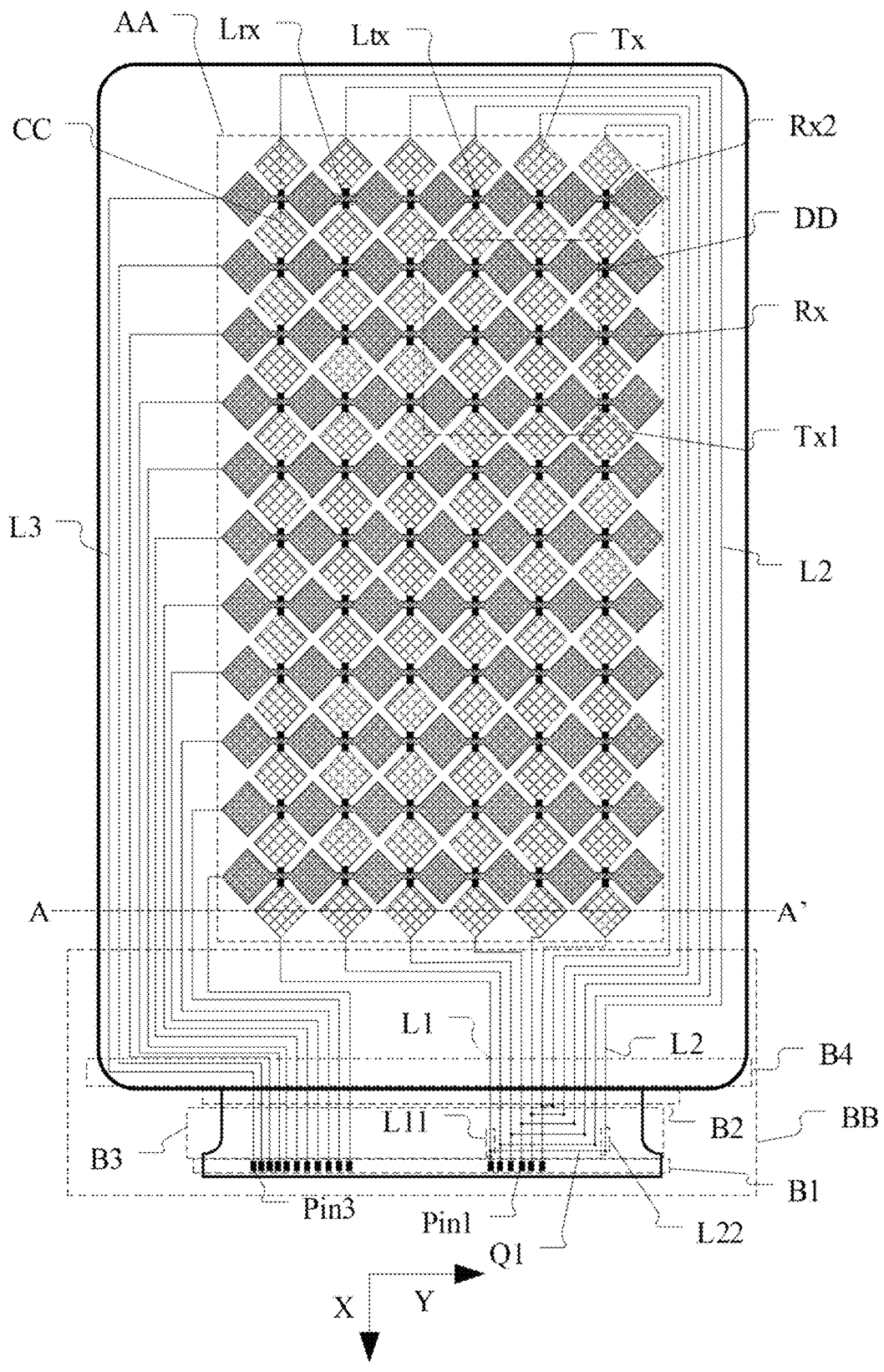
FIG. 2 is a structural schematic diagram of an example embodiment of the display panel of the present disclosure.

Based on this, the example embodiment provides a display panel, as shown in FIG. 2, which is a schematic diagram of the structure of an example embodiment of the display panel of the present disclosure. The display panel includes: a base substrate, a touch function layer, a plurality of first binding pins Pin1, a plurality of first touch leads L1, and a plurality of second touch leads L2. The base substrate includes a display area AA and a first frame area BB, the first frame area BB is located on one side of the display area AA in the first direction X, and the first frame area BB includes a binding area B1; the touch function layer is located on one side of the base substrate, and the touch function layer includes a plurality of first touch electrodes Tx, and the orthographic projection of the first touch electrode Tx on the base substrate is located in the display area AA; the orthographic projections of a plurality of first binding pins Pin1 on the base substrate are located in the binding area B1, and the first binding pin Pin1 is arranged corresponding to the first touch electrode Tx; the first touch lead L1 is connected between the corresponding first binding pin Pin1 and the first touch electrode Tx, and the first touch lead L1 is connected to the first end of the first touch electrode Tx; the second touch lead L2 is connected between the connected first touch electrode Tx and the first touch lead L1, and the second touch lead L2 is connected to the second end of the first touch electrode Tx.

In the display panel provided in this example embodiment, the second touch lead L2 is connected to the first touch lead L1, the same first binding pin Pin1 can provide touch signals to the first touch lead L1 and the second touch lead L2 at the same time. The display panel can reduce the number of first binding pins while improving the touch delay.

Figure 3:
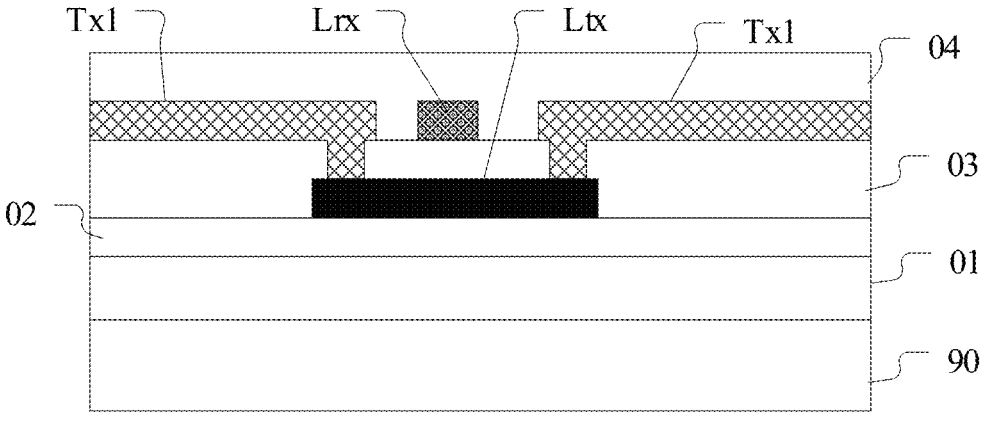
FIG. 3 is a cross-sectional view along the dotted line A-A' of the display panel described in FIG. 2

In this example embodiment, as shown in FIG. 3, it is a cross-sectional view along the dotted line A-A' of the display panel described in FIG. 2. The display panel may include a base substrate 90, a pixel circuit layer 01, a packaging layer 02, a touch function layer, and a protective layer 04 stacked in sequence. The pixel circuit layer 01 may include a pixel driving circuit and a light-emitting unit. As shown in FIGS. 2 and 3, the touch function layer may include a first electrode layer located on the side of the packaging layer 02 away from the base substrate 90, an insulating layer 03 located on the side of the first electrode layer away from the base substrate, and a second electrode layer located on the side of the insulating layer 03 away from the base substrate 90. The first electrode layer may include a first connecting bridge Ltx, and the second electrode layer may include a first sub-electrode Tx1, a second sub-electrode Rx2, and a second connecting bridge Lrx. The plurality of second sub-electrodes Rx2 distributed in the second direction Y may be connected in sequence through the second connecting bridge Lrx to form a second touch electrode Rx; the plurality of first sub-electrodes Tx1 distributed in the first direction X may be connected in sequence through the first connecting bridge Ltx to form a first touch electrode Tx. The first touch electrode Tx and the second touch electrode Rx may form a mutual capacitance structure, and the touch position may be determined by the change in capacitance.

As shown in FIG. 2, the first frame area BB may further include a bending area B2, a first wiring area B3, and a second wiring area B4, wherein the bending area B2 is connected between the display area AA and the binding area B1, the first wiring area B3 is connected between the bending area B2 and the binding area B1, and the second wiring area B4 is connected between the bending area B2 and the display area AA. The first touch lead-out line L1 and the second touch lead-out line L2 located in the bending area B2 can be located in the second source/drain layer in the pixel circuit layer, and the first touch lead-out line L1 and the second touch lead-out line L2 located in the first wiring area B3 and the second wiring area B4 can be located in the second electrode layer in the touch function layer, and the size of the second wiring area B4 in the second direction Y is greater than the size of the bending area B2 in the second direction Y. In this example embodiment, the packaging layer 02 may not cover the bending area B2, the first wiring area B3, and the binding area B1.

In this example embodiment, as shown in FIG. 2, the first touch lead L1 may include a first extension portion L11, the second touch lead L2 may include a second extension portion L22, and the orthographic projection of the first extension portion L11 on the base substrate and the orthographic projection of the second extension portion L22 on the base substrate may be located in the first frame area BB; the display panel may also include: a plurality of first bridge lines Q1, the orthographic projection of the first bridge line Q1 on the base substrate may be located in the first frame area BB, and the first bridge line Q1 is connected between the first extension portion L11 and the second extension portion L22 connected to the same first touch electrode. That is, in the display panel provided in this example embodiment, the first touch lead L1 and the second touch lead L2 are connected through the first bridge line Q1 located in the first frame area BB. It should be understood that, in other example embodiments, the first touch lead L1 and the second touch lead L2 may also have other connection manners, for example, the first touch lead L1 and the second touch lead L2 may be connected through bridge lines located in other frame areas of the display panel.

In this example embodiment, the orthographic projections of the plurality of first extension portions L11 on the base substrate may extend along the first direction X and be spaced apart along the second direction Y, the second direction Y intersects with the first direction X, for example, the first direction X may be a column direction, and the second direction Y may be a row direction. The orthographic projections of the plurality of second extension portions L22 on the base substrate may extend along the first direction X and be spaced apart along the second direction Y, the first extension portion L11 and the second extension portion L22 may be located in the same conductive layer; the orthographic projections of the plurality of first bridge lines Q1 on the base substrate may extend along the second direction Y and be spaced apart along the first direction X, the first bridge line Q1 and the first extension portion L11 may be located in different conductive layers, and the first bridge line Q1 may be connected to the first extension portion L11 and the second extension portion L22 through via holes respectively.

In this example embodiment, as shown in FIG. 2, the size of the orthographic projection of the first touch electrode Tx on the base substrate in its extension direction (first direction X) may be greater than the size of the orthographic projection of the second touch electrode (Rx) on the base substrate in its extension direction (second direction Y). The first touch electrode Tx may be a driving electrode, and the second touch electrode Rx may be a sensing electrode. It should be understood that, in other example embodiments, the first touch electrode Tx may also be a sensing electrode, and the second touch electrode Rx may also be a driving electrode. In addition, in other example embodiments, the orthographic projection of the first touch electrode Tx on the base substrate may also extend along the second direction Y, and the orthographic projection of the second touch electrode Rx on the base substrate may also extend along the first direction X.

Figure 4:
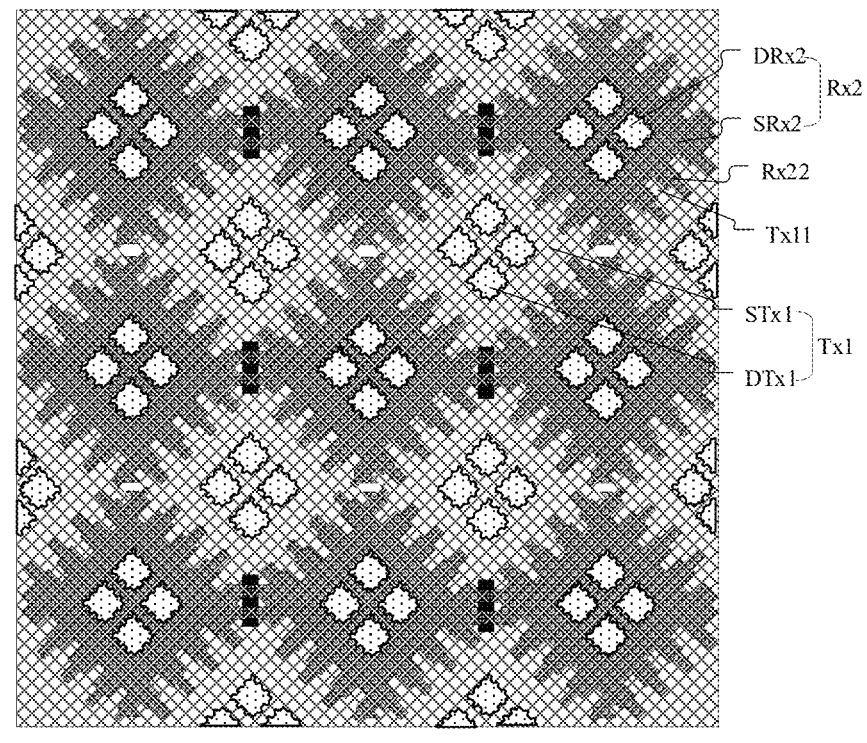
FIG. 4 is a partial enlarged view of the area DD in FIG. 2.

In this example embodiment, as shown in FIG. 4, it is a partial enlarged view of the area DD in FIG. 2. The first sub-electrode Tx1 may include a first physical portion STx1 and a first virtual portion DTx1, the first virtual portion DTx1 and the first physical portion STx1 are not connected, and the first virtual portion DTx1 may adjust the capacitance between the first sub-electrode Tx1 and the second sub-electrode Rx2. The second sub-electrode Rx2 includes a second physical portion SRx2 and a second virtual portion DRx2, the second virtual portion DRx2 and the second physical portion SRx2 are not connected, and the second virtual portion DRx2 can adjust the capacitance between the first sub-electrode Tx1 and the second sub-electrode Rx2. A plurality of first protrusions Tx11 are arranged on the edge of the first physical portion STx1, and a plurality of second protrusions Rx22 are arranged on the edge of the second physical portion SRx2. The first protrusions Tx11 and the second protrusions Rx22 are arranged alternately, so that a lateral capacitor with a large capacitance can be formed between the first sub-electrode Tx1 and the second sub-electrode Rx2.

Figure 5:
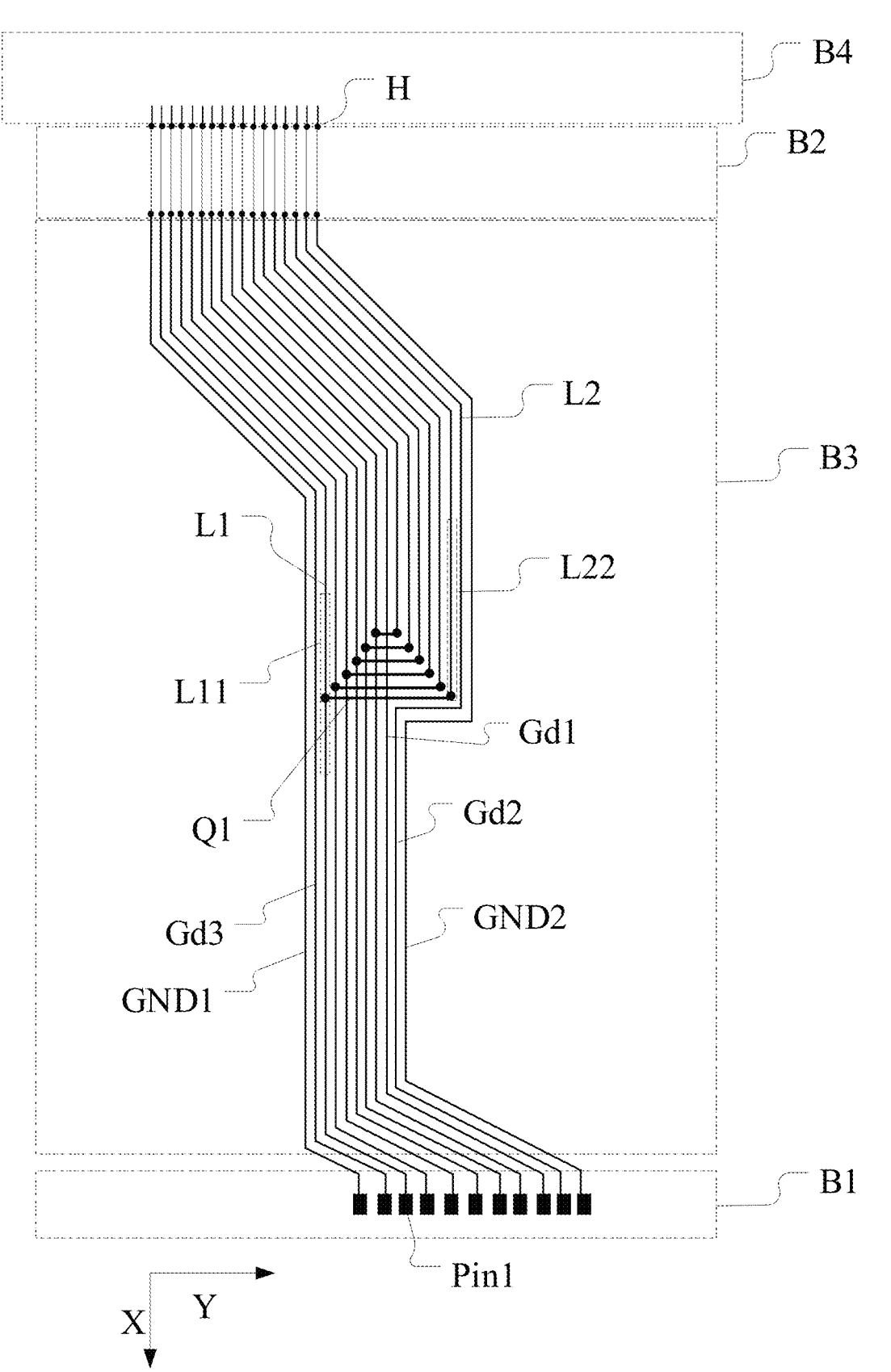
FIG. 5 is a structural schematic diagram of the first frame area in an example embodiment of the display panel of the present disclosure.

As shown in FIG. 5, it is a schematic diagram of the structure of the first frame area in an example embodiment of the display panel of the present disclosure. The first touch lead-out line L1 and the second touch lead-out line L2 located in the bending area B2 can be located in the second source/drain layer in the pixel circuit layer, the first touch lead-out line L1 and the second touch lead-out line L2 located in the first wiring area B3 and the second wiring area B4 can be located in the second electrode layer in the touch function layer, and the first bridge line Q1 can be located in the first electrode layer in the touch function layer. As shown in FIG. 5, the first touch lead-out line L1 located in the bending area B2 can be connected to the first touch lead-out lines L1 located in the first wiring area B3 and the second wiring area B4 through the via holes H, and the second touch lead-out line L2 located in the bending area B2 can be connected to the second touch lead-out lines L2 located in the first wiring area B3 and the second wiring area B4 through the via hole. In this example embodiment, the black circle can represent the position of the via hole. In this example embodiment, as shown in FIG. 5, the orthographic projection of the first bridge line Q1 on the base substrate, the orthographic projection of the first extension portion L11 on the base substrate, and the orthographic projection of the second extension portion L22 on the base substrate can all be located in the first wiring area B3. In some embodiments, the orthographic projection of the first extension portion L11 on the base substrate or the orthographic projection of the second extension portion L22 on the base substrate has at least a partial overlap area with the orthographic projection of the first bridge line Q1 on the base substrate, that is, at least partially intersecting. As shown in FIG. 5, the orthographic projection of the first extension portion L11 on the base substrate has at least a partial overlap area with the orthographic projection of the first bridge line Q1 on the base substrate.

As shown in FIG. 5, the display panel may further include a first protection line Gd1, a second protection line Gd2, a third protection line Gd3, a first ground line GND1, and a second ground line GND2. The orthographic projection of the first protection line Gd1 on the base substrate is located between the orthographic projections of the adjacent first touch lead L1 and the second touch lead L2 on the base substrate. Adjacent first touch leads L1 and second touch leads L2 may refer to first touch leads L1 and second touch leads L2 without first touch leads L1 or second touch leads L2 therebetween. The orthographic projection of the second protection line Gd2 on the base substrate may be located on a side where the orthographic projections of all second touch leads L2 on the base substrate are away from the orthographic projection of the first protection line Gd1 on the base substrate; the orthographic projection of the third protection line Gd3 on the base substrate may be located on a side where the orthographic projections of all first touch leads L1 on the base substrate are away from the orthographic projection of the first protection line Gd1 on the base substrate; the orthographic projection of the first ground line GND1 on the base substrate is located on a side where the orthographic projection of the third protection line Gd3 on the base substrate is away from the orthographic projection of the first touch lead L1 on the base substrate, and the orthographic projection of the second ground line GND2 on the base substrate is located on a side where the orthographic projection of the second protection line Gd2 on the base substrate is away from the orthographic projection of the second touch lead L2 on the base substrate. The first protection line Gd1, the second protection line Gd2, the third protection line Gd3, the first ground line GND1, and the second ground line GND2 located in the bending area B2 can be located in the second source/drain layer in the pixel circuit layer; the first protection line Gd1, the second protection line Gd2, the third protection line Gd3, the first ground line GND1, and the second ground line GND2 located in the first wiring area B3 and the second wiring area B4 can be located in the second electrode layer in the touch function layer. The first protection line Gd1, the second protection line Gd2, and the second ground line GND2 can extend along the extension direction of the second touch lead L2; the third protection line Gd3 and the first ground line GND1 can extend along the extension direction of the first touch lead L1. The first protection line Gd1, the second protection line Gd2, and the third protection line Gd3 can be used to receive touch signals, the first protection line Gd1 and the second protection line Gd2 can make the second touch lead L2 and other second touch leads L2 adjacent thereto have the same electric field environment, and the third protection line Gd3 can make the first touch lead L1 and other first touch leads L1 adjacent thereto have the same electric field environment. It should be noted that, the first protection line Gd1, the second protection line Gd2, and the third protection line Gd3 are not connected to the first touch electrode Tx or the second touch electrode Rx. The first ground line GND1 and the second ground line GND2 can be used to provide a stable power supply signal. For example, the first ground line GND1 and the second ground line GND2 can be grounded, the first ground line GND1 and the second ground line GND2 can shield the noise interference of other signals on the first touch lead L1 and the second touch lead L2.

Figure 6:
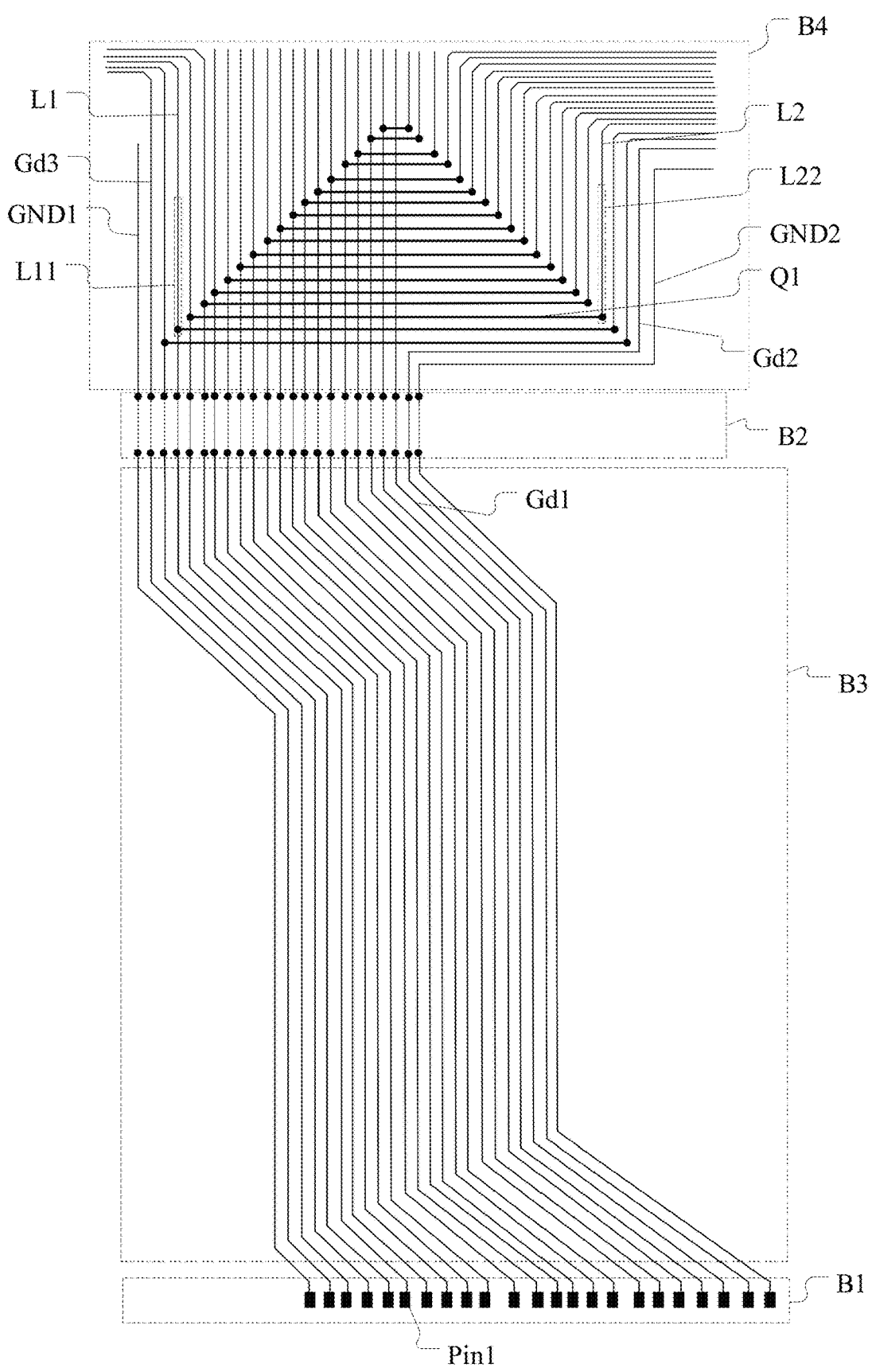
FIG. 6 is a structural schematic diagram of the first frame area in another example embodiment of the display panel of the present disclosure.

In other example embodiments, the first bridge line can also be located at other positions. For example, as shown in FIG. 6, it is a schematic diagram of the structure of the first frame area in another example embodiment of the display panel of the present disclosure. The orthographic projections of the first bridge line Q1, the first extension portion L11 and the second extension portion L22 on the base substrate can be located in the second wiring area B4. The first extension portion L11 and the second extension portion L22 can be located in the second electrode layer, accordingly, the first bridge line Q1 can be located in the first electrode layer. In addition, similarly, the first touch lead-out line L1 and the second touch lead-out line L2 located in the bending area B2 can be located in the second source/drain layer in the pixel circuit layer, and the first touch lead-out line L1 and the second touch lead-out line L2 located in the first wiring area B3 and the second wiring area B4 can be located in the second electrode layer in the touch function layer.

Figure 7:
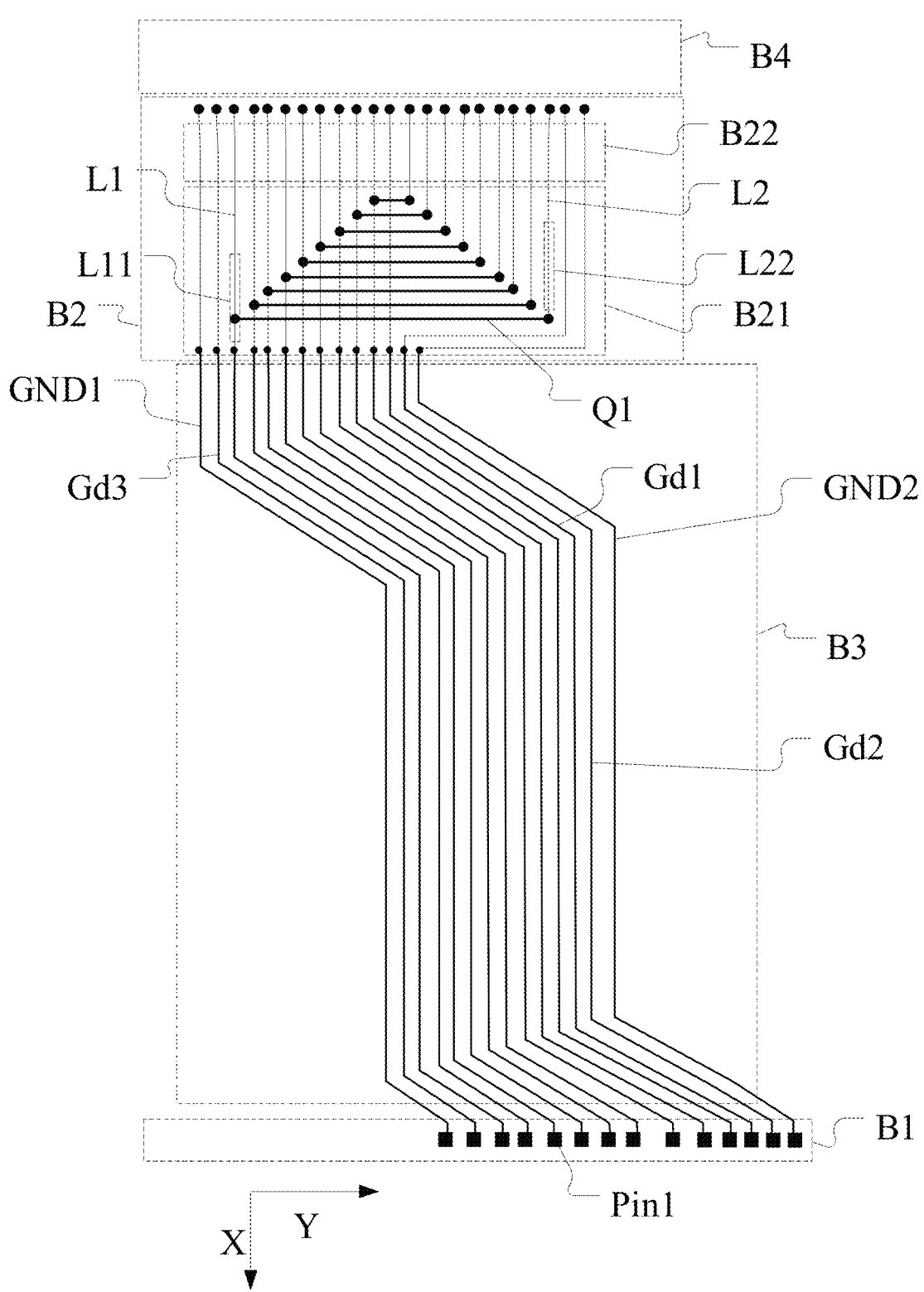
FIG. 7 is a structural schematic diagram of the first frame area in another example embodiment of the display panel of the present disclosure.

For another example, as shown in FIG. 7, it is a schematic diagram of the structure of the first frame area in another example embodiment of the display panel of the present disclosure. The orthographic projections of the first bridge line Q1, the first extension portion L11 and the second extension portion L22 on the base substrate can be located in the bending area B2. The first extension portion L11 and the second extension portion L22 are located in the second source/drain layer, accordingly, the first bridge line Q1 can be located in the first source/drain layer in the pixel circuit layer. Similarly, the first touch lead-out line L1 and the second touch lead-out line L2 located in the bending area B2 can be located in the second source/drain layer in the pixel circuit layer, and the first touch lead-out line L1 and the second touch lead-out line L2 located in the first wiring area B3 and the second wiring area B4 can be located in the second electrode layer in the touch function layer.

In this example embodiment, as shown in FIG. 7, the bending area B2 includes a thinning area B22 and a normal area B21 distributed in the first direction X, and the thickness of the display panel located in the thinning area B22 is smaller than the thickness of the display panel located in the normal area B21; the orthographic projection of the first bridge line Q1 on the base substrate is located in the normal area B21. In this example embodiment, the position of the display panel at the thinning area B22 may not be provided with the protective layer 04 and/or at least part of the inorganic layer in the pixel circuit layer, and this setting can enable the display panel to be bent at a large bending angle at the position of the thinning area B22. It should be understood that, in other example embodiments, the display panel may also reduce the thickness of the display panel at the thinning area B22 by thinning the protective layer 04 and/or at least part of the inorganic layer in the pixel circuit layer.

In this example embodiment, as shown in FIGS. 5, 6, and 7, the arrangement sequence of the orthogonal projections of the first binding pins Pin1 on the base substrate in the second direction Y and the arrangement sequence of the orthogonal projections of the first extension portions L11 connected thereto on the base substrate in the second direction Y may be the same; and the arrangement sequence of the orthogonal projections of the first binding pins Pin1 on the base substrate in the second direction Y and the arrangement sequence of the orthogonal projections of the second extension portions L22 connected thereto on the base substrate in the second direction Y are opposite.

Figure 8:
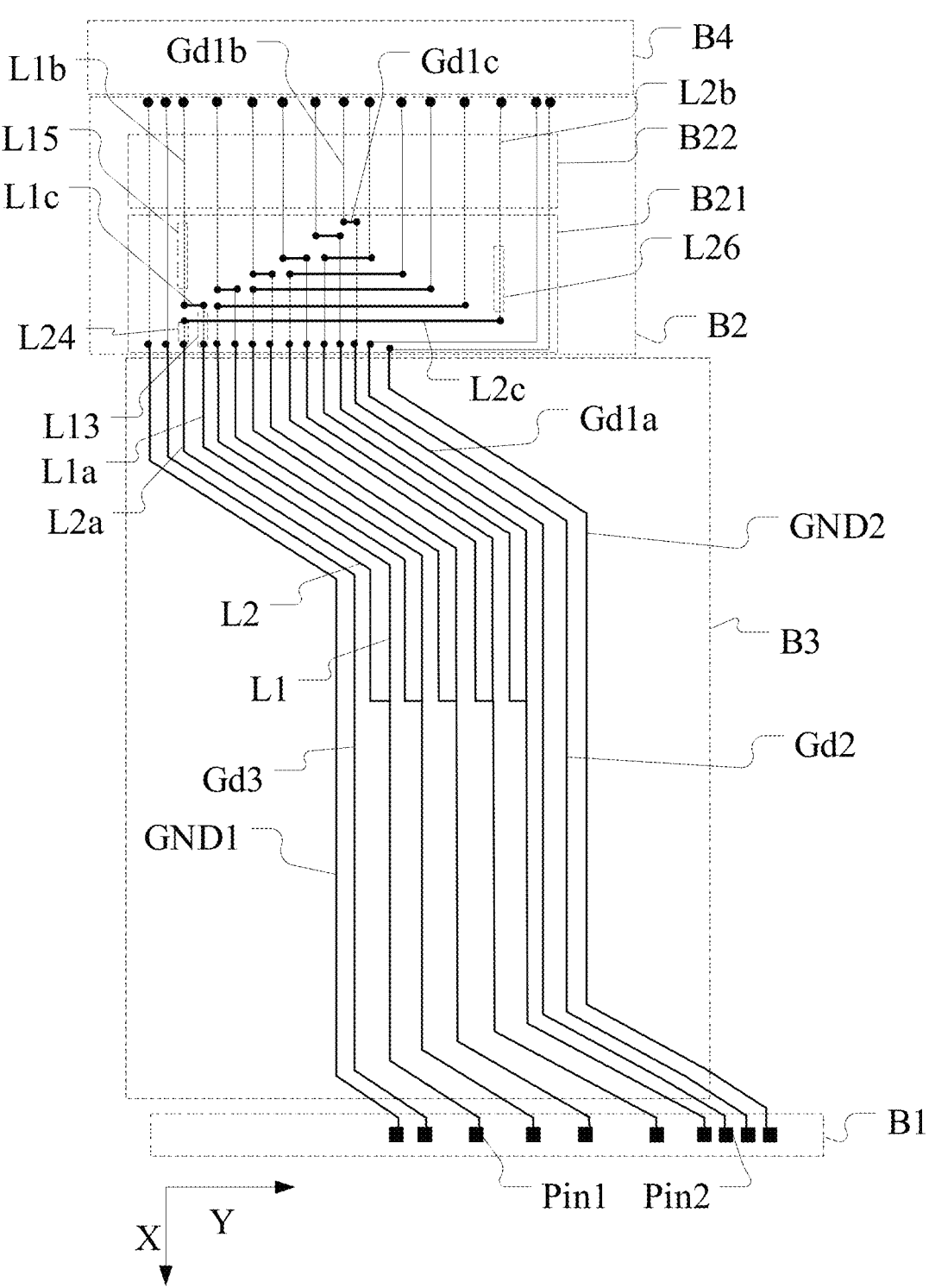
FIG. 8 is a structural schematic diagram of the first frame area in another example embodiment of the display panel of the present disclosure.

In other example embodiments, the first touch lead L1 and the second touch lead L2 may also have other connection manners. For example, as shown in FIG. 8, it is a schematic diagram of the structure of the first frame area in another example embodiment of the display panel of the present disclosure. In this example embodiment, the first touch lead L1 may include: a first lead-out line Lia, a first connection line L1b, and a first sequence change line L1c, the orthographic projection of the first lead-out line L1a on the base substrate extends along the first direction X, and the first lead-out line L1a is connected to the first binding pin Pin1; the orthographic projection of the first connection line L1b on the base substrate extends along the first direction X, and the first connection line L1b is connected to the first end of the first touch electrode Tx, the orthographic projection of the first sequence change line L1c on the base substrate extends along the second direction Y, and the first sequence change line L1c is connected between the first lead-out line L1a and the first connection line L1b. The second touch lead L2 may include: a second lead-out line L2a, a second connection line L2b, and a second sequence change line L2c, the orthographic projection of the second lead-out line L2a on the base substrate extends along the first direction X, the second lead-out line L2a is connected to the first lead-out line L1a, and the orthographic projections of the connected first lead-out line L1a and the second lead-out line L2a on the base substrate are arranged adjacent to each other, that is, no first lead-out line L1a or second lead-out line L2a is arranged between the connected first lead-out line L1a and the second lead-out line L2a; the orthographic projection of the second connection line L2b on the base substrate extends along the first direction X, and the second connection line L2b is connected to the second end of the first touch electrode. The orthographic projection of the second sequence change line L2c on the base substrate extends along the second direction Y, and the second sequence change line L2c is connected between the second lead-out line L2a and the second connection line L2b. In this example embodiment, the first touch lead L1 is connected to the second lead-out line L2a of the second touch lead L2 through the first lead-out line Lia, thereby realizing the connection between the first touch lead L1 and the second touch lead L2. At the same time, in this example embodiment, the sequence of the first lead-out line L1a is changed through the first sequence change line L1c, and the sequence of the second lead-out line L2a is changed through the second sequence change line L2c, so that the lead-out sequence of the first connection line L1b and the second connection line L2b meets the requirements of connecting the first touch electrode.

In this example embodiment, the arrangement sequence of the orthogonal projections of the first binding pins Pin1 on the base substrate in the second direction Y is the same as the arrangement sequence of the orthogonal projections of the first lead-out lines L1a connected thereto on the base substrate in the second direction Y; the arrangement sequence of the orthogonal projections of the first binding pins Pin1 on the base substrate in the second direction Y is the same as the arrangement sequence of the orthogonal projections of the second lead-out lines L2a connected thereto on the base substrate in the second direction Y; the arrangement sequence of the orthogonal projections of the first binding pins Pin1 on the base substrate in the second direction Y is the same as the arrangement sequence of the orthogonal projections of the first connection lines L1b connected thereto on the base substrate in the second direction Y; and the arrangement sequence of the orthogonal projections of the first binding pins Pin1 on the base substrate in the second direction Y is opposite to the arrangement sequence of the orthogonal projections of the second connection lines L2b connected thereto on the base substrate in the second direction Y.

In this example embodiment, as shown in FIG. 8, the first lead-out line L1a may include a third extension portion L13, the orthographic projection of the third extension portion L13 on the base substrate extends along the first direction X; the second lead-out line L2a includes a fourth extension portion L24, the orthographic projection of the fourth extension portion L24 on the base substrate extends along the first direction X; the first connection line L1b includes a fifth extension portion L15, the orthographic projection of the fifth extension portion L15 on the base substrate extends along the first direction X; the second connection line L2b includes a sixth extension portion L26, the orthographic projection of the sixth extension portion L26 on the base substrate extends along the first direction X; the third extension portion L13, the fourth extension portion L24, the fifth extension portion L15, and the sixth extension portion L26 are located in the same conductive layer, the first sequence change line Lac and the second sequence change line L2c are located in the same conductive layer, and the first sequence change line L1c and the third extension portion L13 are located in different conductive layers, the first sequence change line L1c is connected to the third extension portion L13 and the fifth extension portion L15 through via holes respectively, and the second sequence change line L2c is connected to the fourth extension portion L24 and the sixth extension portion L26 through via holes respectively.

In this example embodiment, the orthographic projections of the third extension portion L13, the fourth extension portion L24, the fifth extension portion L15, the sixth extension portion L26, the first sequence change line L1c, and the second sequence change line L2c on the base substrate can all be located in the bending area B2.

In this example embodiment, as shown in FIG. 8, the first sequence change line L1c and the second sequence change line L2c may be located in the first source/drain layer in the pixel circuit layer, and the third extension portion L13, the fourth extension portion L24, the fifth extension portion L15, and the sixth extension portion L26 may be located in the second source/drain layer in the pixel circuit layer.

In this example embodiment, as shown in FIG. 8, the bending area B2 may also include a thinning area B22 and a normal area B21 distributed in the first direction X, and the thickness of the display panel in the thinning area B22 is smaller than the thickness of the display panel in the normal area B21; the orthographic projections of the first sequence change line L1c and the second sequence change line L2c on the base substrate may be located in the normal area B21.

In this example embodiment, as shown in FIG. 8, the display panel may also include: a first protection line Gd1, the first protection line Gd1 can be used to provide touch signals, the first protection line Gd1 may include: a third lead-out line Gd1a, a third connection line Gd1b, and a third sequence change line Gd1c, the orthographic projection of the third lead-out line Gd1a on the base substrate extends along the first direction X, the third lead-out line Gd1a can be connected to the second binding pin Pin2, and the orthographic projection of the second binding pin Pin2 on the base substrate is located in the binding area B1. And the orthographic projections of all the first lead-out lines L1a on the base substrate and the orthographic projections of all the second lead-out lines L2a on the base substrate are located on the same side of the orthographic projection of the third lead-out line Gd1a on the base substrate; the orthographic projection of the third connection line Gd1b on the base substrate extends along the first direction X, and the orthographic projection of the third connection line Gd1b on the base substrate is located between the orthographic projections of the adjacent first connection line L1b and second connection line L2b on the base substrate; the orthographic projection of the third sequence changing line Gd1c on the base substrate extends along the second direction Y, and the third sequence changing line Gd1c is connected between the third lead-out line Gd1a and the third connection line Gd1b. The adjacent first connection line L1b and second connection line L2b may refer to the first connection line L1b and the second connection line L2b between which there is no first connection line L1b or the second connection line L2b. The orthographic projection of the third lead-out line Gd1a on the base substrate may be located in the normal area B21.

It should be noted that, FIGS. 1-2 and 5-8 show the relative position relationship of the first frame area BB, the display area AA, the binding area B1, the bending area B2, the first wiring area B3, the second wiring area B4, the normal area B21, and the thinning area B22. The size of each area can also be other values, and the wiring in each area can also have other wiring manners.

Figure 9:
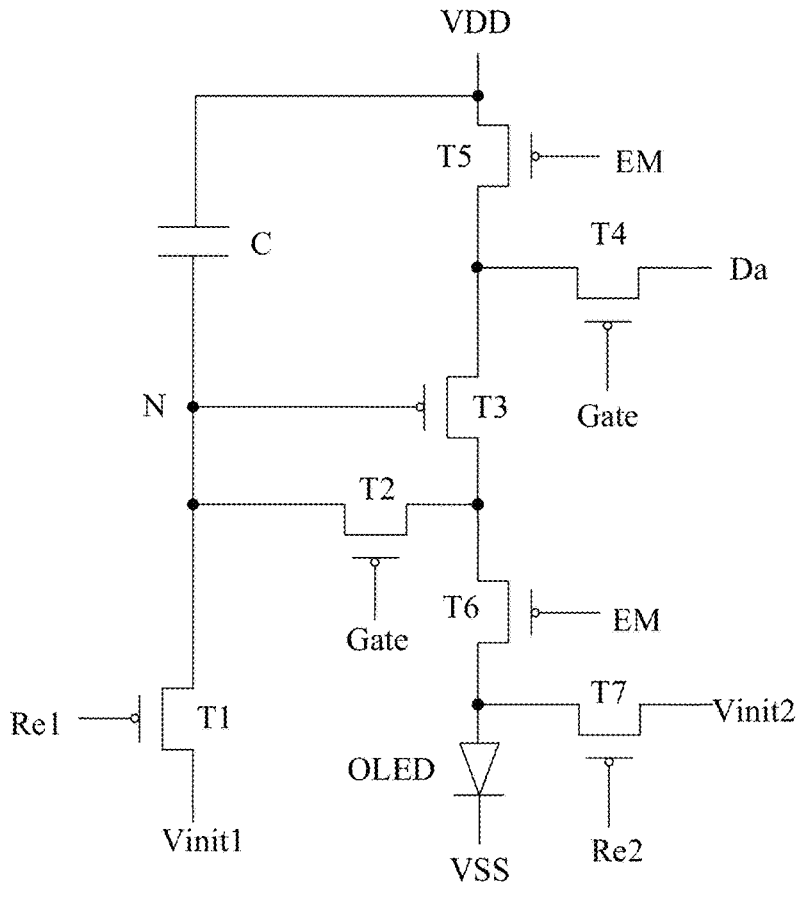
FIG. 9 is a circuit structural schematic diagram of a pixel driving circuit in an example embodiment of the display panel of the present disclosure.

As shown in FIG. 9, it is a circuit structure schematic diagram of a pixel driving circuit in an example embodiment of the display panel of the present disclosure. The pixel driving circuit may include: a first transistor T1, a second transistor T2, a driving transistor T3, a fourth transistor T4, a fifth transistor T5, a sixth transistor T6, a seventh transistor T7, and a capacitor C. The first electrode of the first transistor T1 is connected to the first initial signal terminal Vinit1, the second electrode is connected to the node N, and the gate is connected to the first reset signal terminal Re1; the first electrode of the second transistor T2 is connected to the node N, the second electrode is connected to the second electrode of the driving transistor T3; the gate is connected to the gate driving signal terminal Gate; the gate of the driving transistor T3 is connected to the node N; the first electrode of the fourth transistor T4 is connected to the data signal terminal Da, the second electrode is connected to the first electrode of the driving transistor T3, and the gate is connected to the gate driving signal terminal Gate; the first electrode of the fifth transistor T5 is connected to the first power supply terminal VDD, the second electrode is connected to the first electrode of the driving transistor T3, and the gate is connected to the enable signal terminal EM; the first electrode of the sixth transistor T6 is connected to the second electrode of the driving transistor T3, and the gate is connected to the enable signal terminal EM; the first electrode of the seventh transistor T7 is connected to the second initial signal terminal Vinit2, the second electrode is connected to the second electrode of the sixth transistor T6, and the gate is connected to the second reset signal terminal Re2. The capacitor C is connected between the gate of the driving transistor T3 and the first power supply terminal VDD. The pixel driving circuit can be connected to a light-emitting unit OLED, and the pixel driving circuit can be used to drive the light-emitting unit OLED to emit light, and the light-emitting unit OLED can be connected between the second electrode of the sixth transistor T6 and the second power supply terminal VSS. The transistors T1-T7 can all be P-type transistors.

Figure 10:
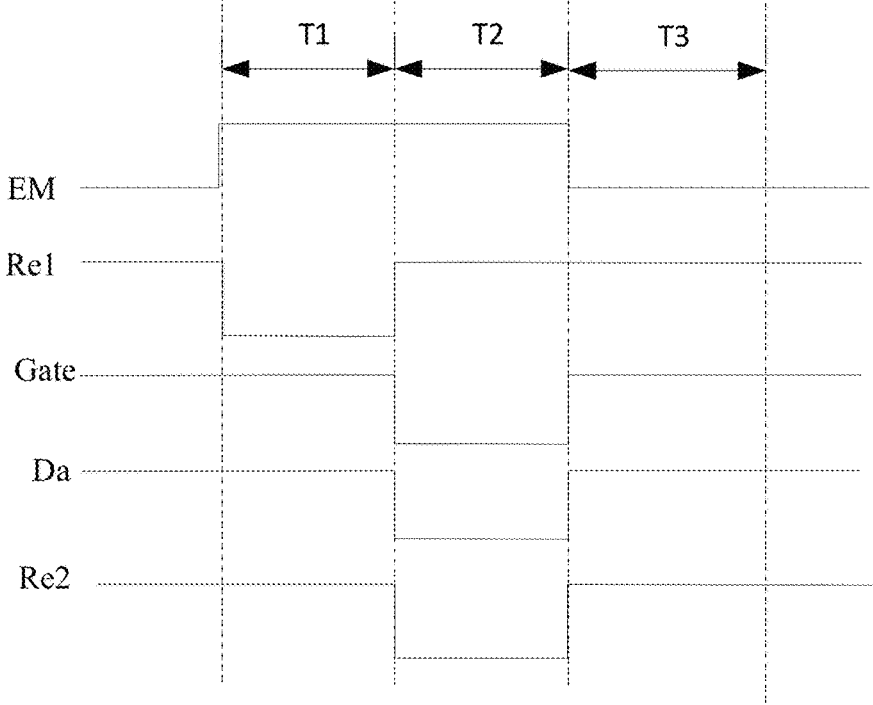
FIG. 10 is a timing diagram of each node in a driving method of the pixel driving circuit of FIG. 9.

As shown in FIG. 10, it is a timing diagram of each node in a driving method of the pixel driving circuit in FIG. 9. The Gate represents the timing of the gate driving signal terminal Gate, Re1 represents the timing of the first reset signal terminal Re1, Re2 represents the timing of the second reset signal terminal Re2, EM represents the timing of the enable signal terminal EM, and Da represents the timing of the data signal terminal Da. The driving method of the pixel driving circuit may include a reset stage t1, a compensation stage t2, and a light-emitting stage t3. In the reset stage t1: the reset signal terminal Re1 outputs a low-level signal, the first transistor T1 is turned on, and the first initial signal terminal Vinit1 inputs the first initial signal to the node N. In the compensation stage t2: the second reset signal terminal Re2 and the gate drive signal terminal Gate output low-level signals, the fourth transistor T4, the second transistor T2, and the seventh transistor T7 are turned on, and the data signal terminal Da outputs a drive signal to write a compensation voltage Vdata+Vth to the node N, where Vdata is the voltage of the drive signal, and Vth is the threshold voltage of the driving transistor T3. The second initial signal terminal Vinit2 inputs the second initial signal to the second electrode of the sixth transistor T6. In the light-emitting stage t3: the enable signal terminal EM outputs a low-level signal, the sixth transistor T6 and the fifth transistor T5 are turned on, and the driving transistor T3 drives the light-emitting unit OLED to emit light under the action of the voltage Vdata+Vth stored in the capacitor C. According to the output current formula of the driving transistor $I=(\mu WCox/2L)(Vgs-Vth)^2$, $\mu$ is the carrier mobility; Cox is the gate capacitance per unit area, W is the width of the driving transistor channel, L is the length of the driving transistor channel, Vgs is the gate-source voltage difference of the driving transistor, and Vth is the threshold voltage of the driving transistor. The output current of the driving transistor in the pixel driving circuit of the present disclosure is $I=(\mu WCox/2L)(Vdata+Vth-Vdd-Vth)^2$. The pixel driving circuit can avoid the influence of the threshold of the driving transistor on its output current.

Figure 11:
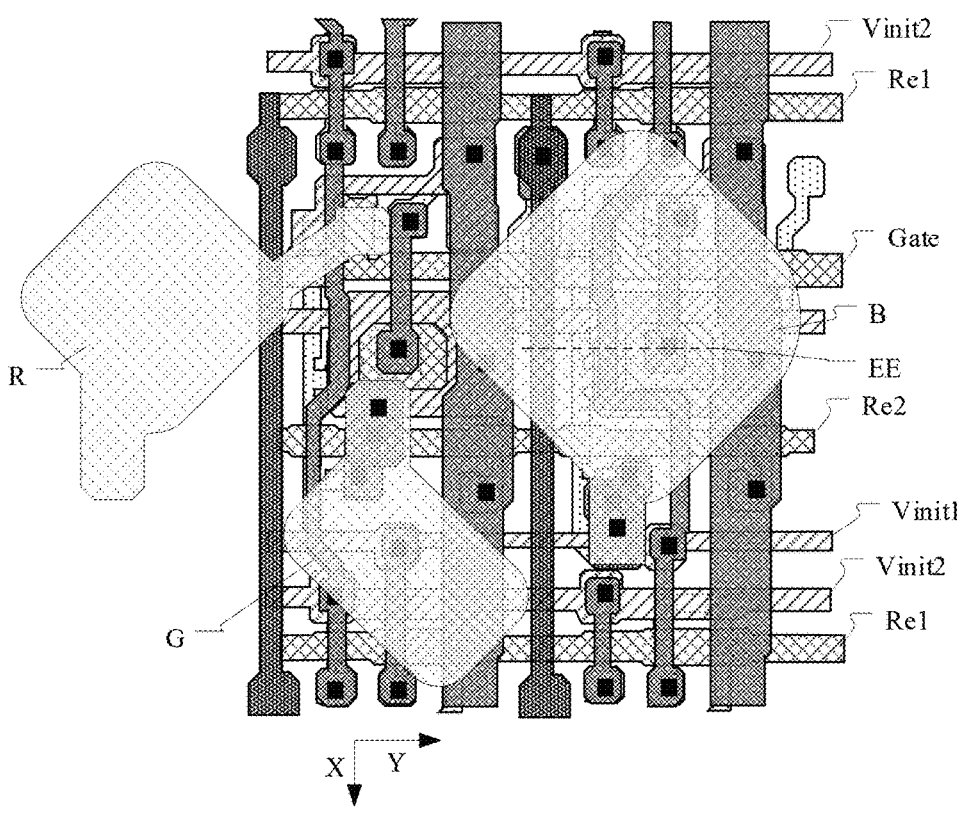
FIG. 11 is a structural layout of a pixel circuit layer in an example embodiment of the display panel of the present disclosure.
Figure 12:
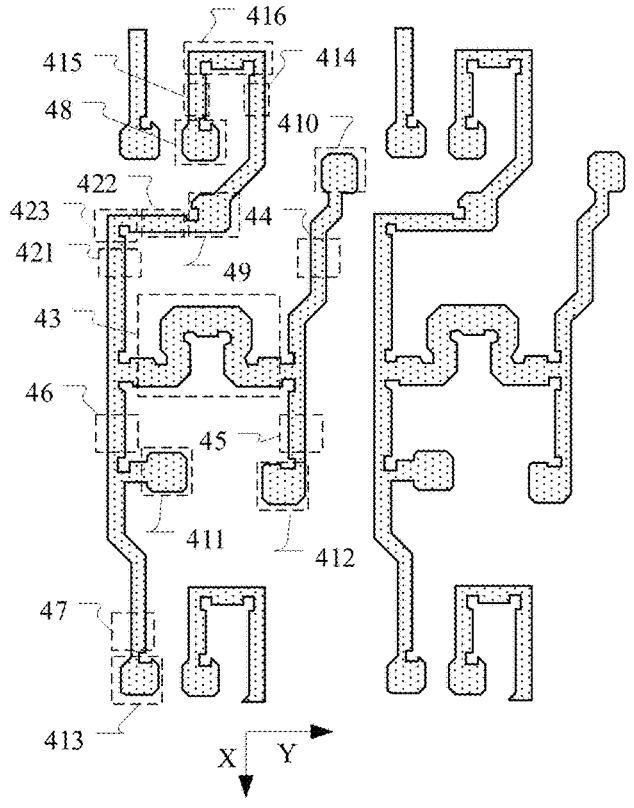
FIG. 12 is the structural layout of the active layer in FIG. 11.
Figure 13:
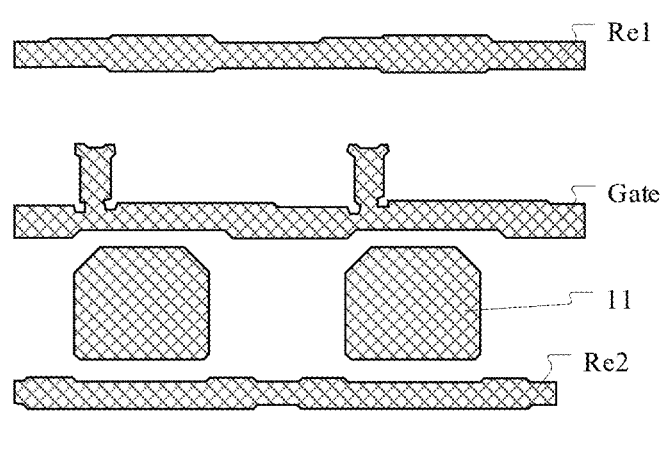
FIG. 13 is the structural layout of the first gate layer in FIG. 11.
Figure 13:
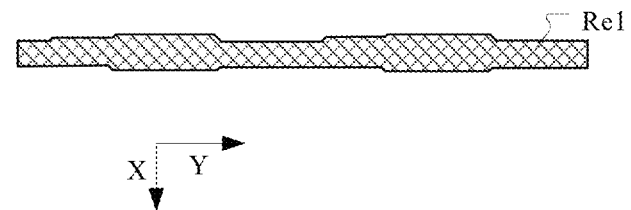
Figure 14:
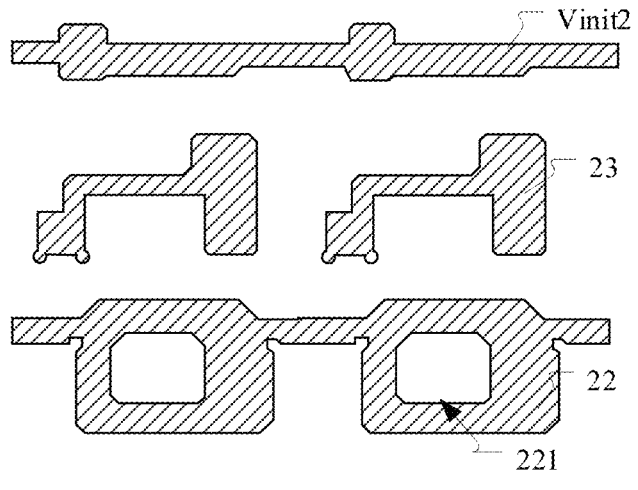
FIG. 14 is the structural layout of the second gate layer in FIG. 11.
Figure 14:
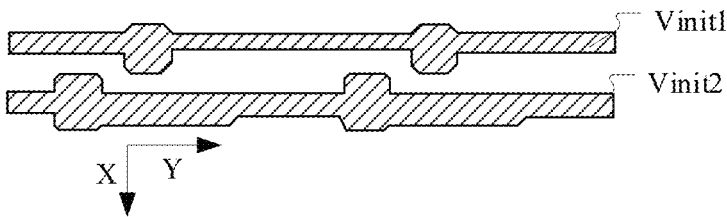
Figure 15:
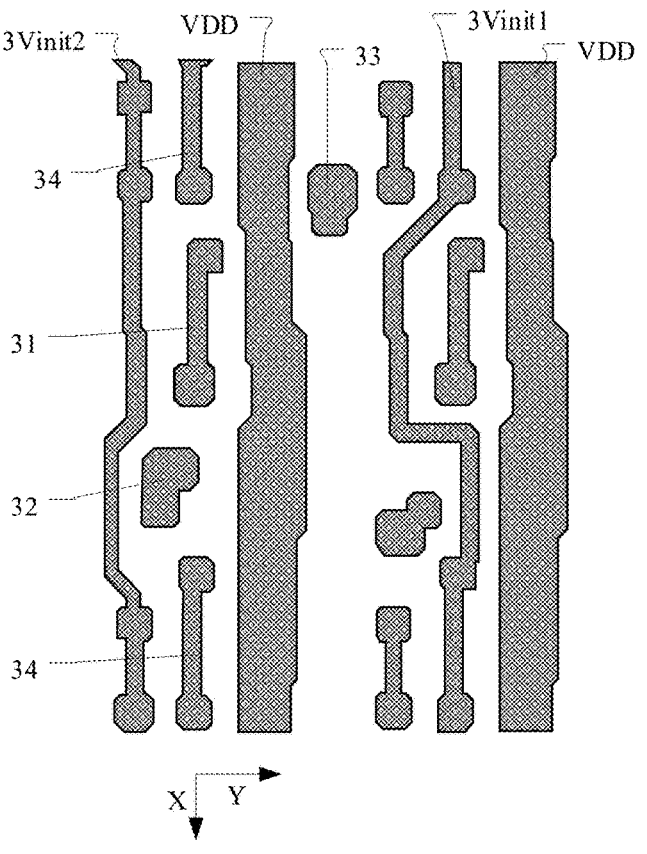
FIG. 15 is the structural layout of the first source/drain layer in FIG. 11.
Figure 16:
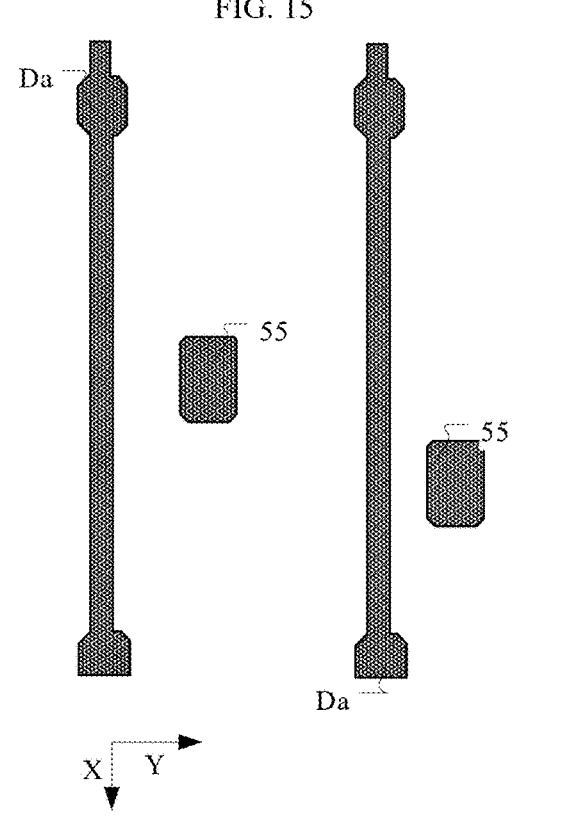
FIG. 16 is the structural layout of the second source/drain layer in FIG. 11.
Figure 17:
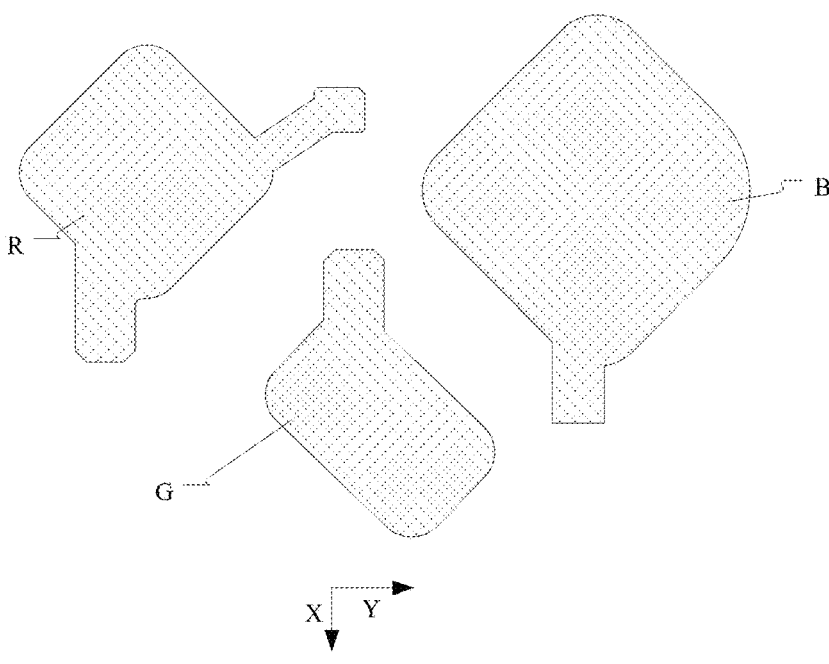
FIG. 17 is the structural layout of the anode layer in FIG. 11.
Figure 18:
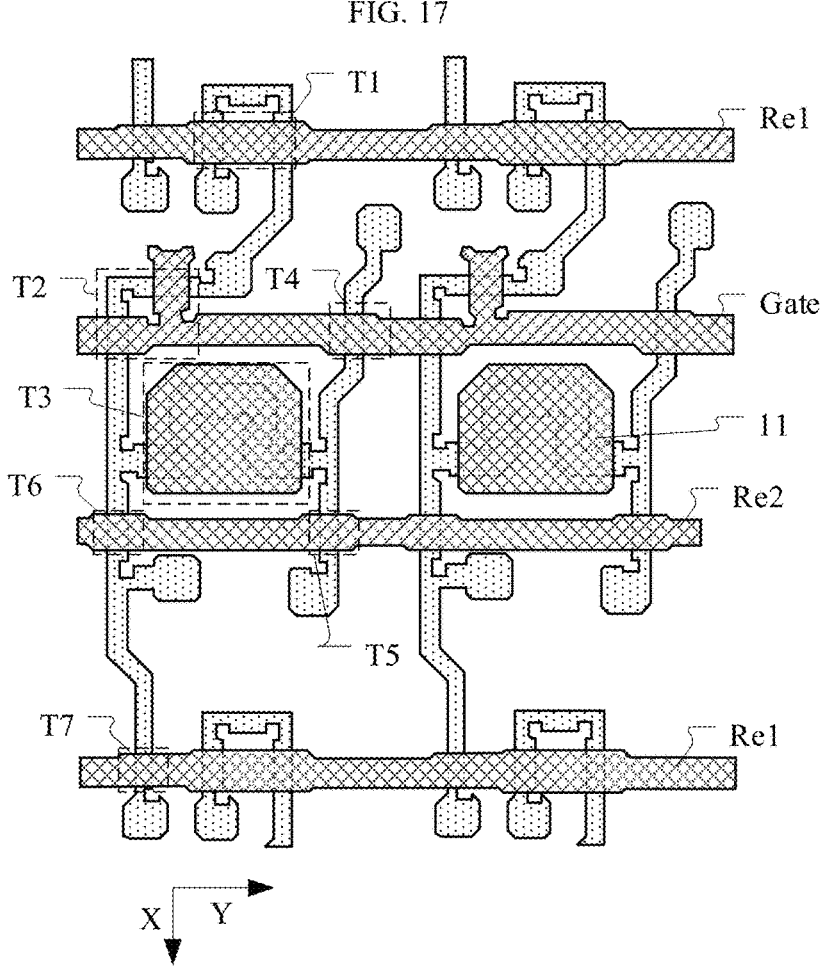
FIG. 18 is the structural layout of the active layer and the first gate layer in FIG. 11.
Figure 19:
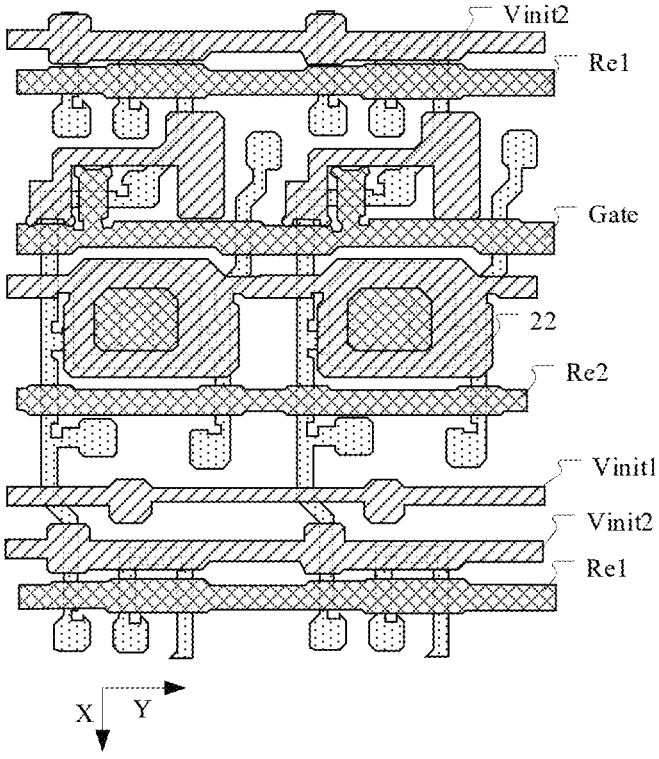
FIG. 19 is the structural layout of the active layer, the first gate layer, and the second gate layer in FIG. 11.
Figure 20:
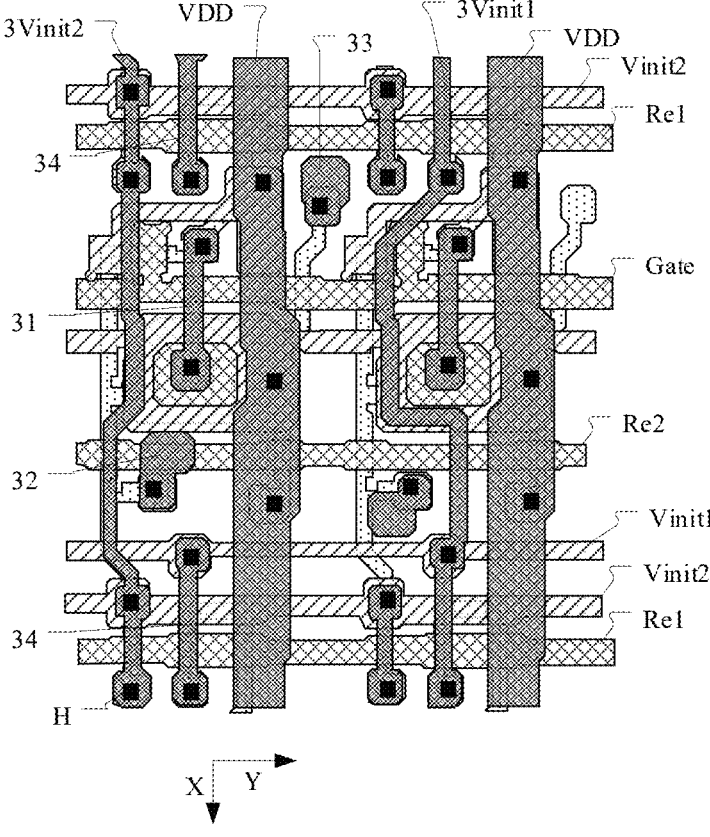
FIG. 20 is the structural layout of the active layer, the first gate layer, the second gate layer, and the first source/drain layer in FIG. 11.
Figure 21:
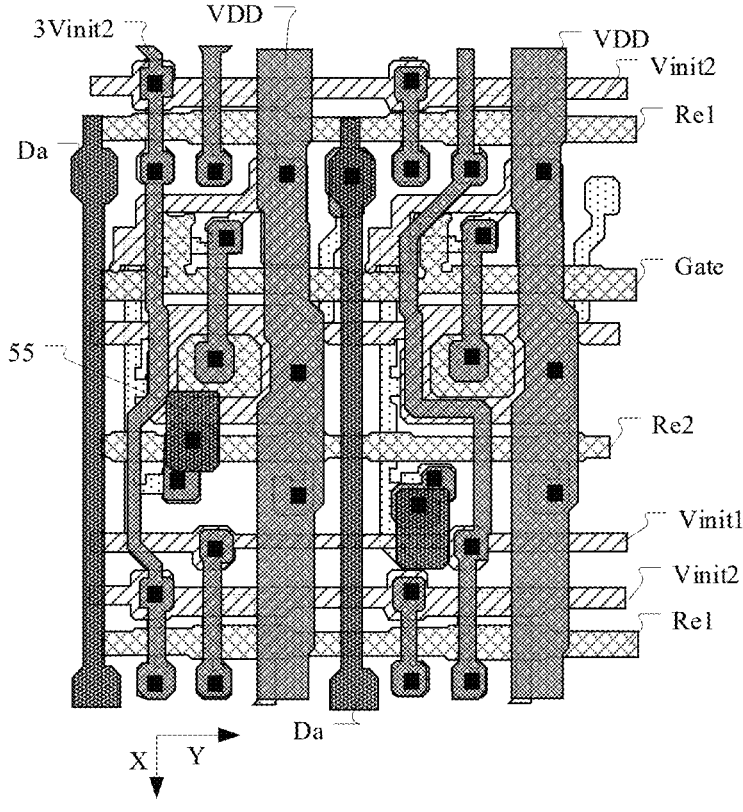
FIG. 21 is the structural layout of the active layer, the first gate layer, the second gate layer, the first source/drain layer, and the second source/drain layer in FIG. 11.

In this example embodiment, the pixel circuit layer may include an active layer, a first gate layer, a second gate layer, a first source/drain layer, a second source/drain layer, and an anode layer stacked in sequence on the base substrate. An insulating layer is provided between the above layers. As shown in FIGS. 11-21, FIG. 11 is a structural layout of a pixel circuit layer in an example embodiment of the display panel of the present disclosure, FIG. 12 is the structural layout of the active layer in FIG. 11, FIG. 13 is the structural layout of the first gate layer in FIG. 11, FIG. 14 is the structural layout of the second gate layer in FIG. 11, FIG. 15 is the structural layout of the first source/drain layer in FIG. 11, FIG. 16 is the structural layout of the second source/drain layer in FIG. 11, FIG. 17 is the structural layout of the anode layer in FIG. 11, FIG. 18 is the structural layout of the active layer and the first gate layer in FIG. 11; FIG. 19 is the structural layout of the active layer, the first gate layer, and the second gate layer in FIG. 11; FIG. 20 is the structural layout of the active layer, the first gate layer, the second gate layer, and the first source/drain layer in FIG. 11; FIG. 21 is the structural layout of the active layer, the first gate layer, the second gate layer, the first source/drain layer, and the second source/drain layer in FIG. 11.

As shown in FIGS. 11, 12, and 18, the active layer may include a third active portion 43, a fourth active portion 44, a fifth active portion 45, a sixth active portion 46, a seventh active portion 47, an eighth active portion 48, a ninth active portion 49, a tenth active portion 410, an eleventh active portion 411, a twelfth active portion 412, a thirteenth active portion 413, a first active sub-portion 421, a second active sub-portion 422, a third active sub-portion 423, a fourth active sub-portion 414, a fifth active sub-portion 415, and a sixth active sub-portion 416. The first active sub-portion 421 and the second active sub-portion 422 can be used to form the channel region of the second transistor T2, the fourth active sub-portion 414 and the fifth active sub-portion 415 can be used to form the channel region of the first transistor T1, the third active portion 43 can be used to form the channel region of the driving transistor T3, the fourth active portion 44 can be used to form the channel region of the fourth transistor T4, the fifth active portion 45 can be used to form the channel region of the fifth transistor T5, the sixth active portion 46 can be used to form the channel region of the sixth transistor T6, the seventh active portion 47 can be used to form the channel region of the seventh transistor T7, and the third active sub-portion 423 is connected between the first active sub-portion 421 and the second active sub-portion 422, the sixth active sub-portion 416 is connected between the fourth active sub-portion 414 and the fifth active sub-portion 415, the eighth active portion 48 is connected to one end of the fifth active sub-portion 415 away from the sixth active sub-portion 416, the ninth active portion 49 is connected between the second active sub-portion 422 and the fourth active sub-portion 414, the tenth active portion 410 is connected to one end of the fourth active portion 44 away from the third active portion 43, the eleventh active portion 411 is connected between the seventh active portion 47 and the sixth active portion 46, the twelfth active portion 412 is connected to one end of the fifth active portion 45 away from the third active portion 43, and the thirteenth active portion 413 is connected to one end of the seventh active portion 47 away from the sixth active portion 46. The active layer may be formed of polysilicon material, and accordingly, the first transistor T1, the second transistor T2, the driving transistor T3, the fourth transistor T4, the fifth transistor T5, the sixth transistor T6, and the seventh transistor T7 may be P-type low-temperature poly-silicon thin film transistors.

As shown in FIGS. 11, 13, and 18, the first gate layer may include: a first reset signal line Re1, a second reset signal line Re2, a gate drive signal line Gate, an enable signal line EM, and a first conductive portion 11. The first reset signal line Re1 can be used to provide a reset signal to the first reset signal terminal in FIG. 9, the second reset signal line Re2 can be used to provide a reset signal to the second reset signal terminal in FIG. 9, the gate drive signal line Gate can be used to provide a drive signal to the gate drive signal terminal in FIG. 9, and the enable signal line EM can be used to provide an enable signal to the enable signal terminal in FIG. 9. The orthographic projections of the first reset signal line Re1, the second reset signal line Re2, the gate drive signal line Gate, and the enable signal line EM on the base substrate can all extend along the second direction Y. A part of the structure of the first reset signal line Re1 can be used to form the gate of the first transistor T1, a part of the structure of the second reset signal line Re2 can be used to form the gate of the seventh transistor T7, a part of the structure of the gate drive signal line Gate can be used to form the gate of the second transistor and the gate of the fourth transistor, and a part of the structure of the enable signal line EM can be used to form the gate of the sixth transistor T6 and the fifth transistor T5. The orthographic projection of the first conductive portion 11 on the base substrate can cover the third active portion 43, and the first conductive portion 11 can be used to form the gate of the driving transistor T3 and an electrode of the capacitor C. The second reset signal line Re2 in the pixel driving circuit of this row can be reused as the first reset signal line Re1 in the pixel driving circuit of the next row.

The display panel can conduct conductive treatment on the active layer by using the patterned first gate layer as a mask, that is, the part blocked by the first gate layer forms the channel region of the transistor, and the part not blocked by the first gate layer forms the conductor structure.

As shown in FIGS. 11, 14, and 19, the second gate layer may include: the first initial signal line Vinit1, the second initial signal line Vinit2, the second conductive portion 22, and the third conductive portion 23. The first initial signal line Vinit1 is used to provide a first initial signal to the first initial signal terminal in FIG. 9, and the second initial signal line Vinit1 is used to provide a second initial signal to the second initial signal terminal in FIG. 9. The orthographic projection of the second initial signal line Vinit2 on the base substrate can overlap with the orthographic projection of the sixth active sub-portion 416 on the base substrate, and the second initial signal line Vinit2 can stabilize the voltage of the sixth active sub-portion 416, thereby reducing the leakage current of the sixth active sub-portion 416 to the source and drain of the first transistor. The orthographic projection of the second conductive portion 22 on the base substrate overlaps at least partially with the orthographic projection of the first conductive portion 11 on the base substrate, and the second conductive portion 22 is used to form the second electrode of the capacitor. The third conductive portion 23 can be connected to a stable power supply, and the orthographic projection of the third conductive portion 23 on the base substrate can overlap with the orthographic projection of the third active sub-portion 423 on the base substrate, and the third conductive portion 23 can stabilize the voltage of the third active sub-portion 423, thereby reducing the leakage current of the third active sub-portion 423 to the source and drain of the second transistor.

As shown in FIGS. 11, 15, and 20, the first source/drain layer may include: a first initial connection line 3Vinit1, a second initial connection line 3Vinit2, a first bridge portion 31, a second bridge portion 32, a third bridge portion 33, a fourth bridge portion 34, and a power supply line VDD. The orthographic projections of the first initial connection line 3Vinit1, the second initial connection line 3Vinit2, and the power supply line VDD on the base substrate may extend along the first direction X. The first bridge portion 31 may be connected to the ninth active portion 49 and the first conductive portion 11 through via holes, respectively, to connect the gate of the driving transistor and the second electrode of the first transistor and the first electrode of the second transistor, and an opening 221 is formed in the second conductive portion 22, the orthographic projection of the via hole connected between the first conductive portion 11 and the first bridge portion 31 on the base substrate may be located within the orthographic projection of the opening 221 on the base substrate, so as to insulate the via hole from the second conductive portion 22. The second bridge portion 32 may be connected to the eleventh active portion 411 through a via hole, to connect the second electrode of the sixth transistor. The third bridge portion 33 can be connected to the tenth active portion 410 through a via hole, to connect the first electrode of the fourth transistor. The fourth bridge portion 34 can be connected to the first initial signal line Vinit1 and the eighth active portion 48 through via holes respectively, to connect the first electrode of the first transistor and the first initial signal terminal. The power supply line VDD can provide a power supply signal to the first power supply terminal in FIG. 9, and the power supply line VDD can be connected to the twelfth active portion 412, the second conductive portion 22, and the third conductive portion 23 through via holes respectively. The second conductive portions 22 distributed in the second direction Y can be connected to each other, and the interconnected second conductive portions 22 and the power supply line VDD can form a grid structure, to reduce the resistance of the power supply line. In this example embodiment, a first initial connection line 3Vinit1 and a second initial connection line 3Vinit2 are correspondingly set for every two columns of pixel driving circuits. The first initial connection line 3Vinit1 can be connected to the eighth active portion 48 and the first initial signal line Vinit1 through via holes respectively, to connect the first electrode of the first transistor and the first initial signal terminal, the first initial connection line 3Vinit1 can form a grid structure of the first initial signal line Vinit1, to reduce the resistance of the first initial signal line Vinit1. The second initial connection line 3Vinit2 can be connected to the second initial signal line Vinit2 and the thirteenth active portion 413 through via holes respectively, to connect the first electrode of the seventh transistor and the second initial signal terminal. At the same time, the second initial connection line 3Vinit2 can form a grid structure of the second initial signal line Vinit2, to reduce the resistance of the second initial signal line Vinit2.

As shown in FIGS. 11, 16, and 21, the second source/drain layer may include: a data line Da and a fifth bridge portion 55, the orthographic projection of the data line Da on the base substrate may extend along the first direction X, the data line Da may provide a driving signal to the data signal terminal in FIG. 9, and the data line Da may be connected to the third bridge portion 33 through a via hole, to connect the first electrode of the fourth transistor and the data signal terminal. The fifth bridge portion 55 can be connected to the second bridge portion 32 through a via hole.

As shown in FIGS. 11 and 17, the anode layer may include a plurality of anode portions, and the plurality of anode portions may include a first anode portion R, a second anode portion G, and a third anode portion B. The first anode portion R is used to form the anode of the red light-emitting unit, the second anode portion G is used to form the anode of the green light-emitting unit, and the third anode portion B is used to form the anode of the blue light-emitting unit. The anode portion can be connected to the fifth bridge portion 55 through a via hole.

It should be noted that, as shown in FIGS. 11, 20, and 21, the black squares drawn on the side of the anode layer away from the base substrate represent via holes connecting the anode layer to other layers facing the base substrate; the black squares drawn on the side of the second source/drain layer away from the base substrate represent via holes connecting the second source/drain layer to other layers facing the base substrate; and the black squares drawn on the side of the first source/drain layer away from the base substrate represent via holes connecting the first source/drain layer to other layers facing the base substrate. The black square indicates the position of the via hole, and different via holes represented by black squares at different positions can penetrate through different insulating layers. In addition, the pixel circuit layer may also include a pixel definition layer and a light-emitting unit layer located on the side of the anode layer away from the base substrate.

Figure 22:
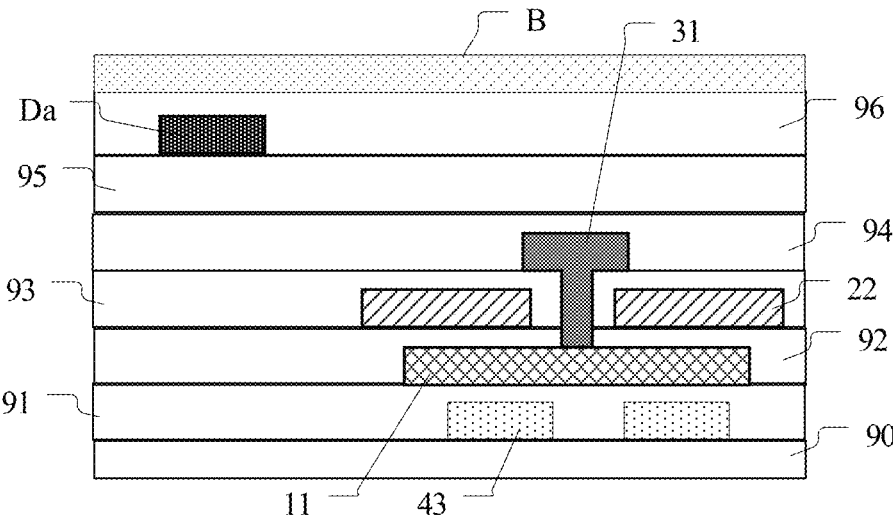
FIG. 22 is a partial cross-sectional view along the dotted line EE in FIG. 11.

As shown in FIG. 22, it is a partial cross-sectional view along the dotted line EE in FIG. 11. The display panel may also include: a first insulating layer 91, a second insulating layer 92, a dielectric layer 93, a passivation layer 94, a first flat layer 95, and a second flat layer 96. The base substrate 90, the active layer, the first insulating layer 91, the first gate layer, the second insulating layer 92, the second gate layer, the dielectric layer 93, the first source/drain layer, the passivation layer 94, the first flat layer 95, the second source/drain layer, the second flat layer 96, and the anode layer can be stacked in sequence. The first insulating layer 91 and the second insulating layer 92 can be silicon oxide layers; the dielectric layer 93 can be a silicon nitride layer; the passivation layer 94 can be a silicon nitride layer; the materials of the first flat layer 95 and the second flat layer 96 can be transparent polyimide (CPI), polyethylene terephthalate (PET), polyethylene naphthalate (PEN) and other materials. The materials of the first gate layer and the second gate layer can be one of molybdenum, aluminum, copper, titanium, niobium or alloys, or molybdenum/titanium alloys or stacks, etc. The materials of the first source/drain layer and the second source/drain layer can include metal materials, for example, one of molybdenum, aluminum, copper, titanium, niobium or alloys, or molybdenum/titanium alloys or stacks, etc., or titanium/aluminum/titanium stacks. The anode layer can include an indium tin oxide layer and a silver layer. The square resistance of any conductive layer in the first gate layer and the second gate layer can be greater than the square resistance of the first source/drain layer and the second source/drain layer.

It should be noted that, the proportions of the drawings in the present disclosure can be used as a reference in the actual process, but are not limited to this. For example, the width-to-length ratio of the channel, the thickness and spacing of each film layer, and the width and spacing of each signal line can be adjusted according to actual needs. The number of pixels in the display substrate and the number of sub-pixels in each pixel are not limited to the number shown in the drawings. The drawings described in the present disclosure are only structural schematic diagrams. In addition, the first, second and other qualifiers are only used to define different structural names, and they do not have a specific order and quantity. In this example embodiment, the orthographic projection of a certain structure on the base substrate extending in a certain direction can be understood as the orthographic projection of the structure on the base substrate extending straightly or bendingly along the direction. A transistor refers to an element including at least three terminals: a gate, a drain and a source. The transistor has a channel region between the drain (a drain electrode terminal, a drain region or a drain electrode) and the source (a source electrode terminal, a source region or a source electrode), and the current can flow through the drain, the channel region and the source. In this example embodiment, the channel region refers to the region where the current mainly flows. In this example embodiment, the first electrode may be a drain electrode, the second electrode may be a source electrode, or the first electrode may be a source electrode, and the second electrode may be a drain electrode. In the case of using transistors with opposite polarities or when the current direction changes during circuit operation, the functions of the "source electrode" and the "drain electrode" are sometimes interchanged. Therefore, in this example embodiment, the "source electrode" and the "drain electrode" may be interchanged. In addition, the gate electrode may also be referred to as a control electrode.

This example embodiment also provides a display apparatus, which includes the above-mentioned display panel. The display apparatus may be a display apparatus such as a mobile phone, a tablet computer, a television, etc.

After considering the description and practicing the contents disclosed herein, it will be easy for a person skilled in the art to think of other embodiments of the present disclosure. This application is intended to cover any variation, use or adaptive change of the present disclosure, which follows the general principles of the present disclosure and includes common knowledge or conventional technical means in the technical field not disclosed in the present disclosure. The description and embodiments are only regarded as exemplary, and the true scope and spirit of the present disclosure are indicated by the claims.

The drawings in the present disclosure only relate to the structures involved in the present disclosure, and other structures may refer to the usual design. In the absence of conflicts, the embodiments of the present disclosure and the features in the embodiments can be combined with each other to obtain new embodiments. It should be understood by those skilled in the art that, the technical solution of the present disclosure can be modified or replaced by equivalents, without departing from the spirit and scope of the technical solution of the present disclosure, which should be included in the scope of the claims of the present disclosure.

It should be understood that the present disclosure is not limited to the precise structure described above and shown in the drawings, and various modifications and changes can be made without departing from its scope. The scope of the present disclosure is limited only by the attached claims.

The invention claimed is:

1. A display panel, comprising:

a base substrate, comprising a display area and a first frame area, wherein the first frame area is located on a side of the display area in a first direction, and the first frame area comprises a binding area;

a touch function layer, located on a side of the base substrate, wherein the touch function layer comprises a plurality of first touch electrodes, and an orthographic projection of the first touch electrode on the base substrate is located in the display area;

a plurality of first binding pins, wherein orthographic projections of the first binding pins on the base substrate are located in the binding area, the first binding pin is arranged corresponding to the first touch electrode;

a plurality of first touch leads, wherein the first touch lead is connected between the first binding pin and the first touch electrode corresponding to each other, and the first touch lead is connected to a first end of the first touch electrode; and a plurality of second touch leads, wherein the second touch lead is connected between the first touch electrode and the first touch lead connected to each other, and the second touch lead is connected to a second end of the first touch electrode, wherein the first binding pin is connected to the first touch electrode through the first touch lead and the second touch lead;

wherein the second touch lead comprises:

a second lead-out line, wherein an orthographic projection of the second lead-out line on the base substrate extends along the first direction, the second lead-out line is connected to the first lead-out line, and orthographic projections of the first lead-out line and second lead-out line connected to each other on the base substrate are arranged adjacent to each other;

a second connection line, wherein an orthographic projection of the second connection line on the base substrate extends along the first direction, the second connection line is connected to the second end of the first touch electrode;

a first sequence change line, wherein an orthographic projection of the first sequence change line on the base substrate extends along a second direction, the second direction intersects with the first direction, the first sequence change line is connected between the first lead-out line and the first connection line;

a second sequence change line, wherein an orthographic projection of the second sequence change line on the base substrate extends along the second direction, the second sequence change line is connected between the second lead-out line and the second connection line.

2. The display panel according to claim 1, wherein the first touch lead comprises a first extension portion, the second touch lead comprises a second extension portion, and an orthographic projection of the first extension portion on the base substrate and an orthographic projection of the second extension portion on the base substrate are located in the first frame area;

wherein the display panel further comprises:

a plurality of first bridge lines, wherein an orthographic projection of the first bridge line on the base substrate is located in the first frame area, and the first bridge line is connected between the first extension portion and the second extension portion connected to an identical first touch electrode.

3. The display panel according to claim 2, wherein orthographic projections of the plurality of first extension portions on the base substrate extend along the first direction and are spaced along a second direction, and the second direction intersects with the first direction;

orthographic projections of the plurality of second extension portions on the base substrate extend along the first direction and are spaced along the second direction, and the first extension portion and the second extension portion are located in an identical conductive layer;

orthographic projections of the plurality of first bridge lines on the base substrate extend along the second direction and are spaced along the first direction, the first bridge line and the first extension portion are located in different conductive layers, and the first bridge line is connected to the first extension portion and the second extension portion through via holes respectively.

4. The display panel according to claim 2, wherein the first frame area further comprises a bending area and a first wiring area, the bending area is connected between the binding area and the display area, and the first wiring area is connected between the bending area and the binding area;

the orthographic projection of the first bridge line on the base substrate, the orthographic projection of the first extension portion on the base substrate, and the orthographic projection of the second extension portion on the base substrate are all located in the first wiring area.

5. The display panel according to claim 2, wherein the first frame area further comprises a bending area and a second wiring area, the bending area is connected between the binding area and the display area, and the second wiring area is connected between the bending area and the display area;

the orthographic projection of the first bridge line on the base substrate, the orthographic projection of the first extension portion on the base substrate, and the orthographic projection of the second extension portion on the base substrate are all located in the second wiring area.

6. The display panel according to claim 5, wherein a size of the second wiring area in a second direction is greater than a size of the bending area in the second direction, and the second direction intersects with the first direction.

7. The display panel according to claim 4, wherein the touch function layer further comprises a second touch electrode, the first touch electrode comprises a plurality of first sub-electrodes, and the second touch electrode comprises a plurality of second sub-electrodes;

the touch function layer comprises:

a first electrode layer, located on a side of the base substrate, wherein the first electrode layer comprises the first bridge line and a connecting bridge, the connecting bridge is used to connect adjacent first sub-electrodes, or the connecting bridge is used to connect adjacent second sub-electrodes;

a second electrode layer, located on a side of the first electrode layer away from the base substrate, wherein the second electrode layer comprises the first extension portion, the second extension portion, the first sub-electrode, and the second sub-electrode.

8. The display panel according to claim 2, wherein the first frame area further comprises a bending area, the bending area is connected between the binding area and the display area;

the orthographic projection of the first bridge line on the base substrate, the orthographic projection of the first extension portion on the base substrate, and the orthographic projection of the second extension portion on the base substrate are all located in the bending area.

9. The display panel according to claim 8, wherein the bending area comprises a thinning area and a normal area distributed in the first direction, and a thickness of the display panel in the thinning area is smaller than a thickness of the display panel in the normal area;

the orthographic projection of the first bridge line on the base substrate is located in the normal area.

10. The display panel according to claim 2, wherein an arrangement sequence of the orthogonal projections of the first binding pins on the base substrate in a second direction is identical with an arrangement sequence of the orthogonal projections of the first extension portions connected to the first binding pins on the base substrate in the second direction, and the second direction intersects with the first direction;

the arrangement sequence of the orthogonal projections of the first binding pins on the base substrate in the second direction is opposite to an arrangement sequence of the orthogonal projections of the second extension portions connected to the first binding pins on the base substrate in the second direction.

11. The display panel according to claim 1, wherein the first touch lead comprises:

a first lead-out line, wherein an orthographic projection of the first lead-out line on the base substrate extends along the first direction, the first lead-out line is connected to the first binding pin;

a first connection line, wherein an orthographic projection of the first connection line on the base substrate extends along the first direction, the first connection line is connected to the first end of the first touch electrode.

12. The display panel according to claim 11, wherein an arrangement sequence of the orthogonal projections of the first binding pins on the base substrate in the second direction is identical with an arrangement sequence of the orthogonal projections of the first lead-out lines connected to the first binding pins on the base substrate in the second direction;

the arrangement sequence of the orthogonal projections of the first binding pins on the base substrate in the second direction is identical with an arrangement sequence of the orthogonal projections of the second lead-out lines connected to the first binding pins on the base substrate in the second direction;

the arrangement sequence of the orthogonal projections of the first binding pins on the base substrate in the second direction is identical with an arrangement sequence of the orthogonal projections of the first connection lines connected to the first binding pins on the base substrate in the second direction;

the arrangement sequence of the orthogonal projections of the first binding pins on the base substrate in the second direction is opposite to an arrangement sequence of the orthogonal projections of the second connection lines connected to the first binding pins on the base substrate in the second direction.

13. The display panel according to claim 11, wherein the first lead-out line comprises a third extension portion, an orthographic projection of the third extension portion on the base substrate extends along the first direction;

the second lead-out line comprises a fourth extension portion, an orthographic projection of the fourth extension portion on the base substrate extends along the first direction;

the first connection line comprises a fifth extension portion, an orthographic projection of the fifth extension portion on the base substrate extends along the first direction;

the second connection line comprises a sixth extension portion, an orthographic projection of the sixth extension portion on the base substrate extends along the first direction;

the third extension portion, the fourth extension portion, the fifth extension portion, and the sixth extension portion are located in an identical conductive layer, the first sequence change line and the second sequence change line are located in an identical conductive layer, and the first sequence change line and the third extension portion are located in different conductive layers, the first sequence change line is connected to the third extension portion and the fifth extension portion through via holes respectively, and the second sequence change line is connected to the fourth extension portion and the sixth extension portion through via holes respectively.

14. The display panel according to claim 13, wherein the first frame area further comprises a bending area, and the bending area is connected between the binding area and the display area;

the orthographic projections of the third extension portion, the fourth extension portion, the fifth extension portion, the sixth extension portion, the first sequence change line, and the second sequence change line on the base substrate are located in the bending area.

15. The display panel according to claim 14, wherein the display panel further comprises: a pixel circuit layer, the pixel circuit layer is located between the base substrate and the touch function layer, and the pixel circuit layer comprises:

a first source/drain layer, located between the base substrate and the touch function layer, wherein the first source/drain layer comprises the first sequence change line and the second sequence change line;

a second source/drain layer, located between the first source/drain layer and the touch function layer, wherein the second source/drain layer comprises the third extension portion, the fourth extension portion, the fifth extension portion and the sixth extension portion.

16. The display panel according to claim 14, wherein the bending area comprises a thinning area and a normal area distributed in the first direction, and a thickness of the display panel in the thinning area is smaller than a thickness of the display panel in the normal area;

the orthographic projections of the first sequence change line and the second sequence change line on the base substrate are located in the normal area.

17. The display panel according to claim 1, wherein the touch function layer further comprises: a second touch electrode, the first touch electrode comprises a plurality of first sub-electrodes distributed in an identical direction, the second touch electrode comprises a plurality of second sub-electrodes distributed in an identical direction, and a distribution direction of the first sub-electrodes intersects with a distribution direction of the second sub-electrodes;

the first sub-electrodes and the second sub-electrodes are located in an identical conductive layer, and a size of the orthographic projection of the first touch electrode on the base substrate in an extension direction of the first touch electrode is greater than a size of the orthographic projection of the second touch electrode on the base substrate in an extension direction of the second touch electrode.

18. The display panel according to claim 11, wherein the display panel further comprises: a first protection line, the first protection line is used to provide a touch signal, and the first protection line comprises:

a third lead-out line, wherein an orthographic projection of the third lead-out line on the base substrate extends along the first direction, the third lead-out line is connected to a second binding pin, and the orthographic projections of all first lead-out lines on the base substrate and the orthographic projections of all second lead-out lines on the base substrate are located on an identical side of the orthographic projection of the third lead-out line on the base substrate;

a third connection line, wherein an orthographic projection of the third connection line on the base substrate extends along the first direction, the orthographic projection of the third connection line on the base substrate is located between the orthographic projections of the first connection line and the second connection line adjacent to each other on the base substrate;

a third sequence change line, wherein an orthographic projection of the third sequence change line on the base substrate extends along the second direction, the third sequence change line is connected between the third lead-out line and the third connection line.

19. A display apparatus, comprising a display panel, wherein the display panel comprises:

a base substrate, comprising a display area and a first frame area, wherein the first frame area is located on a side of the display area in a first direction, and the first frame area comprises a binding area;

a touch function layer, located on a side of the base substrate, wherein the touch function layer comprises a plurality of first touch electrodes, and an orthographic projection of the first touch electrode on the base substrate is located in the display area;

a plurality of first binding pins, wherein orthographic projections of the first binding pins on the base substrate are located in the binding area, the first binding pin is arranged corresponding to the first touch electrode;

a plurality of first touch leads, wherein the first touch lead is connected between the first binding pin and the first touch electrode corresponding to each other, and the first touch lead is connected to a first end of the first touch electrode; and a plurality of second touch leads, wherein the second touch lead is connected between the first touch electrode and the first touch lead connected to each other, and the second touch lead is connected to a second end of the first touch electrode, wherein the first binding pin is connected to the first touch electrode through the first touch lead and the second touch lead;

wherein the second touch lead comprises:

a second lead-out line, wherein an orthographic projection of the second lead-out line on the base substrate extends along the first direction, the second lead-out line is connected to the first lead-out line, and orthographic projections of the first lead-out line and second lead-out line connected to each other on the base substrate are arranged adjacent to each other;

a second connection line, wherein an orthographic projection of the second connection line on the base substrate extends along the first direction, the second connection line is connected to the second end of the first touch electrode;

a first sequence change line, wherein an orthographic projection of the first sequence change line on the base substrate extends along a second direction, the second direction intersects with the first direction, the first sequence change line is connected between the first lead-out line and the first connection line;

a second sequence change line, wherein an orthographic projection of the second sequence change line on the base substrate extends along the second direction, the second sequence change line is connected between the second lead-out line and the second connection line.

\* \* \* \* \*